(12) United States Patent
Nanba

(10) Patent No.: US 11,447,863 B2
(45) Date of Patent: Sep. 20, 2022

(54) PARTICLE COATING DEVICE

(71) Applicant: SEIKO EPSON CORPORATION, Tokyo (JP)

(72) Inventor: Teruaki Nanba, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 17/005,741

(22) Filed: Aug. 28, 2020

(65) Prior Publication Data
US 2021/0062340 A1    Mar. 4, 2021

(30) Foreign Application Priority Data

Aug. 30, 2019  (JP) .............................. JP2019-157925

(51) Int. Cl.
  *C23C 16/455*   (2006.01)
  *C23C 16/52*    (2006.01)
  *C23C 16/44*    (2006.01)

(52) U.S. Cl.
  CPC .... *C23C 16/45544* (2013.01); *C23C 16/4417* (2013.01); *C23C 16/52* (2013.01)

(58) Field of Classification Search
  None
  See application file for complete search history.

(56) References Cited

FOREIGN PATENT DOCUMENTS

| JP | H11021677 A  |   | 1/1999 |
|----|--------------|---|--------|
| JP | 2007204784 A |   | 8/2007 |
| JP | 2016152372 A |   | 8/2016 |
| JP | 2020139211 A | * | 9/2020 |

* cited by examiner

*Primary Examiner* — Karla A Moore
(74) *Attorney, Agent, or Firm* — Chip Law Group

(57) ABSTRACT

A particle coating device includes a container having a powder supply port that supplies a powder, a first rotation introducer provided below the powder supply port, a second rotation introducer provided below the first rotation introducer, a first magnet roller coupled with the first rotation introducer, a second magnet roller coupled with the second rotation introducer, a first drive unit that rotates the first magnet roller, a second drive unit that rotates the second magnet roller, a control unit that controls an operation of the first drive unit and an operation of the second drive unit, and a film forming unit that supplies a coating material for coating particles in the powder into the container. A product $r_1\omega_1^2$ of a rotation radius $r_1$ and a square of a rotation speed $\omega_1$ per unit time of the first magnet roller is larger than a product $r_2\omega_2^2$ of a rotation radius $r_2$ and a square of a rotation speed $\omega_2$ per unit time of the second magnet roller.

12 Claims, 15 Drawing Sheets

PARTICLE COATING DEVICE

The present application is based on, and claims priority from JP Application Serial Number 2019-157925, filed Aug. 30, 2019, the disclosure of which is hereby incorporated by reference herein in its entirety.

BACKGROUND

1. Technical Field

The present disclosure relates to a particle coating device.

2. Related Art

For a magnetic powder used in an inductor or the like, it is required to perform an insulation processing on particle surfaces and prevent an eddy current flowing among particles. Therefore, a method is considered to form an insulation coating film on surfaces of particles in the magnetic powder using various film forming methods.

For example, JP-A-2007-204784 (Patent Literature 1) discloses a method using a bottomed cylindrical particle container as a method for coating a thin film on surfaces of particles by sputtering a coating material onto the particles. Specifically, the particles are accommodated in the bottomed cylindrical particle container, an axis of the cylindrical particle container serves as a rotation axis, and the rotation axis is inclined at a predetermined angle with respect to a horizontal direction. In such a state, the particle container is rotated and the coating material is sputtered.

On the other hand, when there is a distribution in particle diameters of particles to be coated with the coating material, that is, when the particle diameters of the particles vary with each other, a film thickness of a thin film may be greatly different for each particle. For example, when the coating material is sputtered, particles having a small particle diameter may be hidden behind particles having a large particle diameter as viewed from a flight direction of the coating material. In such a case, there is a possibility that no thin film is formed on surfaces of the small particles. If so, an insulation property of the small particles may not be ensured and a characteristic of the entire magnetic powder may be deteriorated. Therefore, it is required to reduce a variation in film thicknesses of the thin film even when there is a distribution in the particle diameters of the particles, that is, even when particles having a large diameter and particles having a small diameter are mixed.

SUMMARY

A particle coating device according to an application example of the present disclosure includes a container having a powder supply port that supplies a powder, a first rotation introducer that is provided below the powder supply port and passes through an inner side and an outer side of the container, a second rotation introducer that is provided below the first rotation introducer and passes through the inner side and the outer side of the container, a first magnet roller that is provided inside the container, is coupled with the first rotation introducer, and generates a magnetic field, a second magnet roller that is provided inside the container, is coupled with the second rotation introducer, and generates a magnetic field, a first drive unit that drives the first rotation introducer and rotates the first magnet roller, a second drive unit that drives the second rotation introducer and rotates the second magnet roller, a control unit that controls an operation of the first drive unit and an operation of the second drive unit, and a film forming unit that supplies a coating material for coating particles in the powder into the container. A product $r_1 \omega_1^2$ of a rotation radius $r_1$ and a square of a rotation speed $\omega_1$ per unit time of the first magnet roller is larger than a product $r_2 \omega_2^2$ of a rotation radius $r_2$ and a square of a rotation speed $\omega_2$ per unit time of the second magnet roller.

DESCRIPTION OF EXEMPLARY EMBODIMENTS

Hereinafter, preferred embodiments of a particle coating device according to the present disclosure will be described in detail with reference to accompanying drawings.

1. First Embodiment

Figure 1:
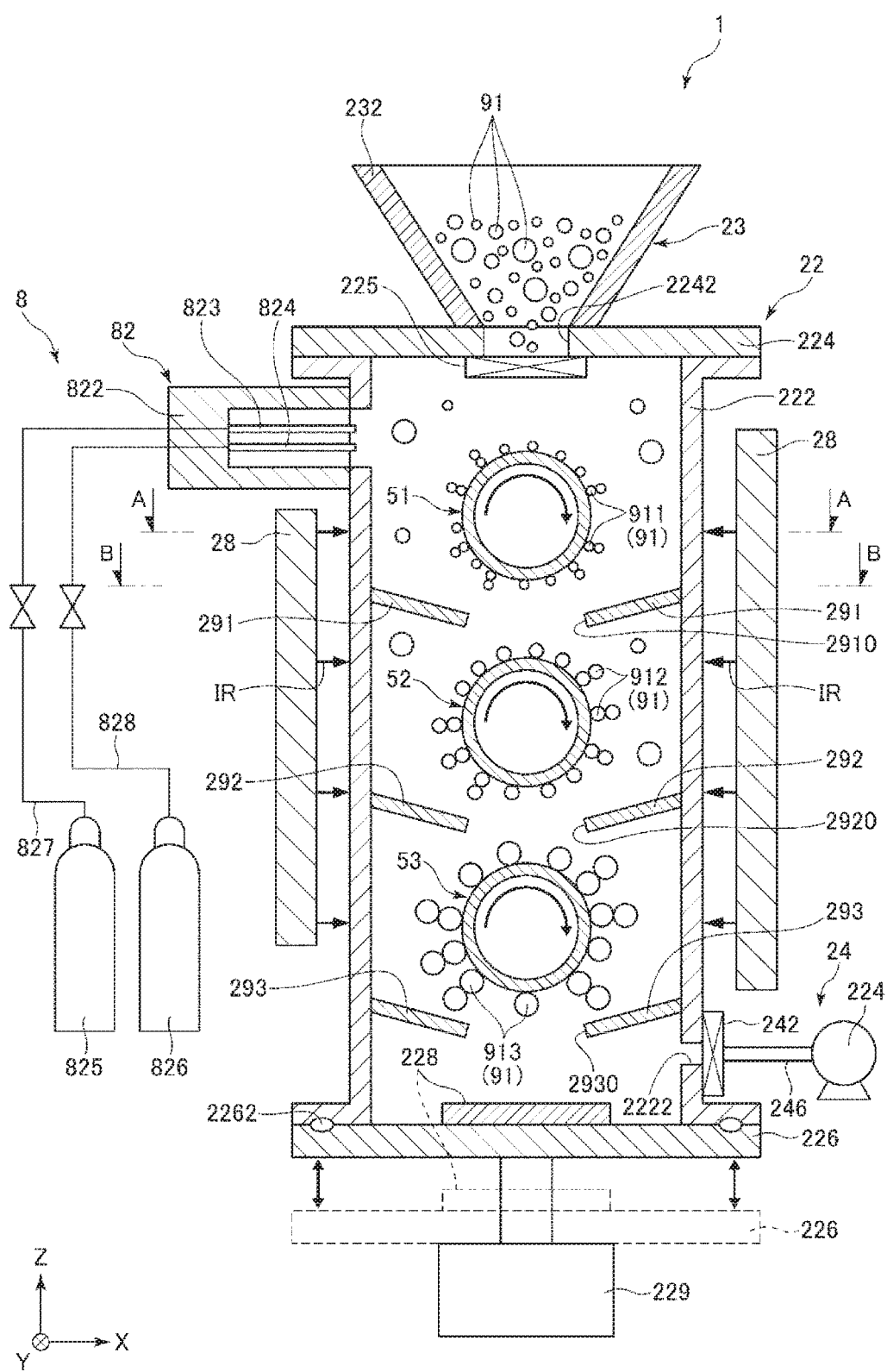
FIG. 1 is a cross-sectional view showing a particle coating device according to a first embodiment.
Figure 2:
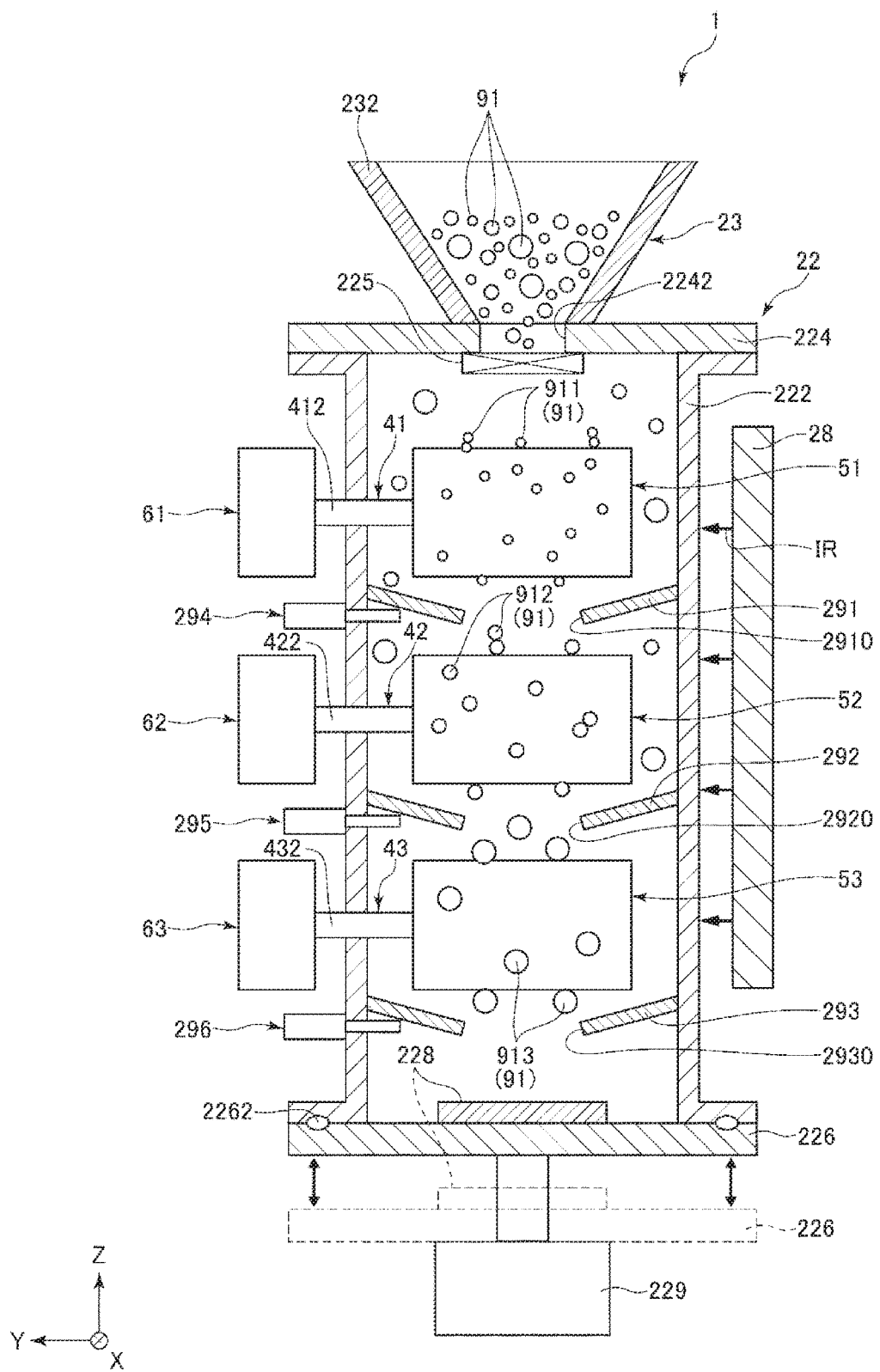
FIG. 2 is a cross-sectional view showing the particle coating device according to the first embodiment.
Figure 3:
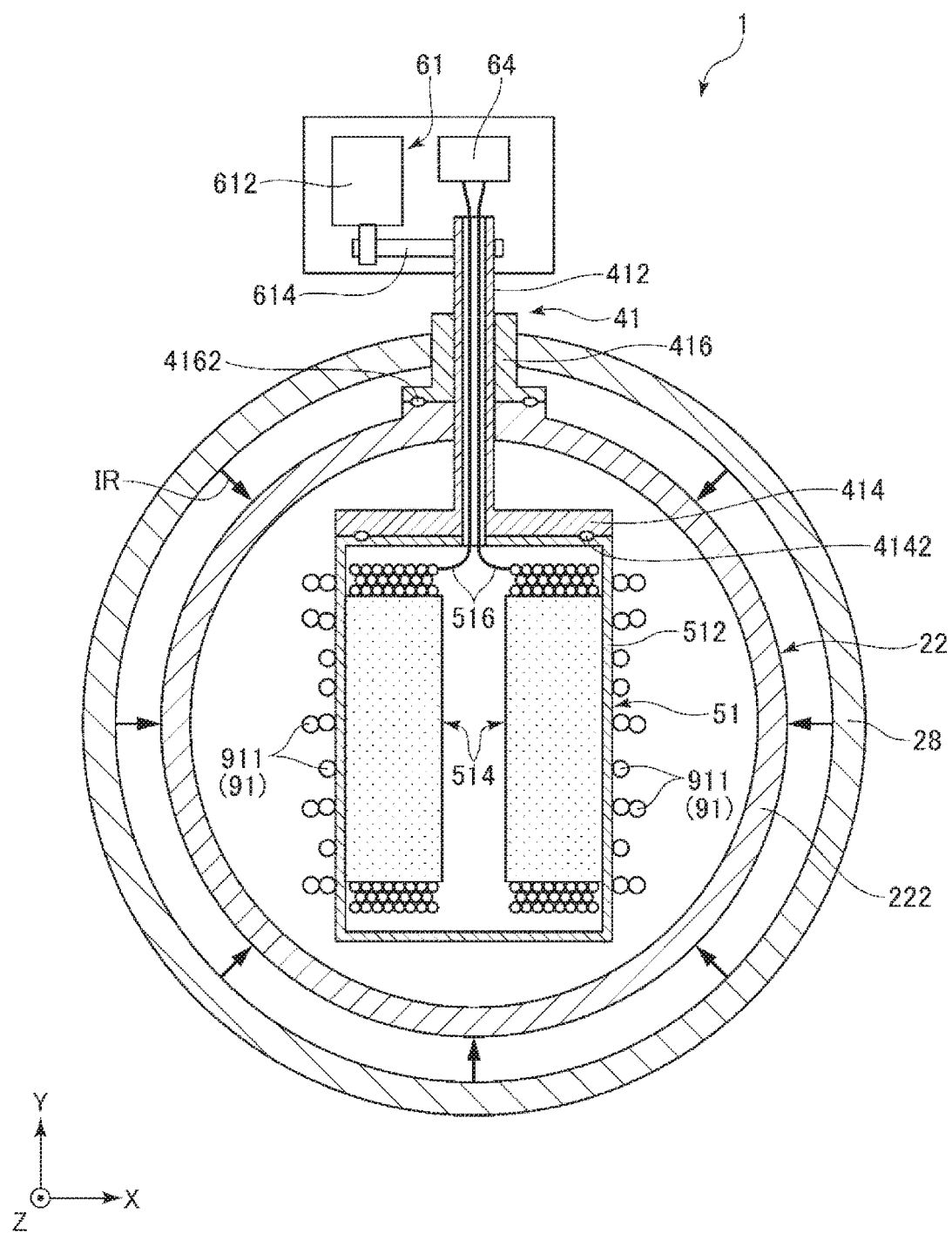
FIG. 3 is a cross-sectional view showing a chamber shown in FIG. 1 and taken along a line A-A.
Figure 4:
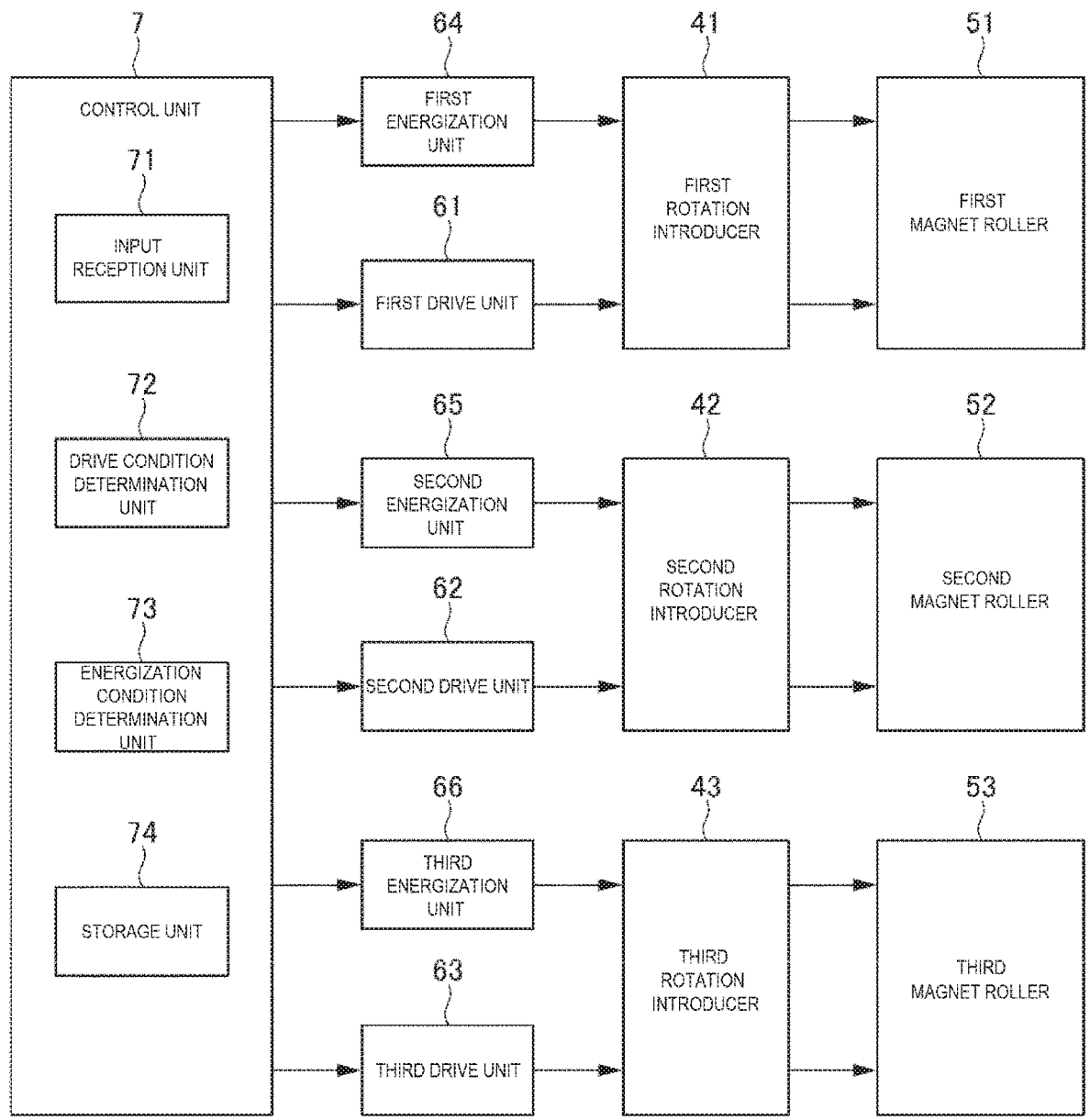
FIG. 4 is a functional block diagram showing the particle coating device shown in FIG. 1.
Figure 5:
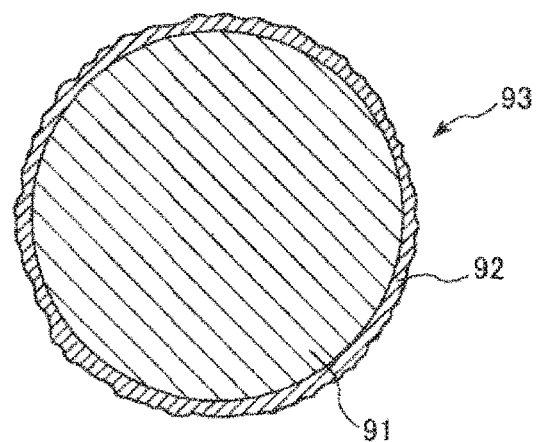
FIG. 5 is a cross-sectional view showing a coated magnetic particle formed by forming a coating film on a surface of a magnetic particle by the particle coating device shown in FIG. 1.

FIGS. 1 and 2 are cross-sectional views showing a particle coating device 1 according to the first embodiment. Positions of the cross-sectional views are different from each other. FIG. 3 is a cross-sectional view showing a chamber 22 shown in FIG. 1 and taken along a line A-A. FIG. 4 is a functional block diagram showing the particle coating device 1 shown in FIG. 1. FIG. 5 is a cross-sectional view showing a coated magnetic particle 93 formed by forming a coating film 92 on a surface of a magnetic particle 91 by the particle coating device 1 shown in FIG. 1. In the drawings of the present application, an X axis, a Y axis, and a Z axis are set as three axes orthogonal to each other. In the drawings, each axis is indicated by an arrow. A tip end side of the arrow is referred to as a "positive side" and a base end side is referred to as a "negative side". In particular, a positive side of the Z axis is also referred to as an "upper" side and a negative side of the Z axis is also referred to as a "lower" side. In the drawings, the Z axis is parallel to a vertical axis and an X-Y plane is parallel to a horizontal plane.

The particle coating device 1 shown in FIGS. 1 to 4 includes the chamber 22 (a container), a first rotation introducer 41, a second rotation introducer 42, a third rotation introducer 43, a first magnet roller 51, a second magnet roller 52, a third magnet roller 53, a first drive unit 61, a second drive unit 62, a third drive unit 63, a control unit 7, and a film forming unit 8.

The first magnet roller 51, the second magnet roller 52, and the third magnet roller 53 are arranged in this order from a vertical upper side toward a vertical lower side in the chamber 22. The first magnet roller 51, the second magnet roller 52, and the third magnet roller 53 generate magnetic fields and fix the magnetic particles 91 supplied into the chamber 22. The magnetic particles 91 are particles in a magnetic powder.

The film forming unit 8 supplies a coating material into the chamber 22. The supplied coating material is stacked on surfaces of the magnetic particles 91 and the coating film 92 is formed. That is, the film forming unit 8 forms the coating film 92 on surfaces of the magnetic particles 91 that constitute the magnetic powder. Accordingly, the magnetic particles 91 are coated with the coating film 92.

In the particle coating device 1, the first magnet roller 51, the second magnet roller 52, and the third magnet roller 53 generate magnetic fields, and the coating film 92 is formed on the surfaces of the magnetic particles 91 in a state in which the magnetic particles 91 are fixed by a magnetic force. Accordingly, the coating film 92 can be formed on the surfaces of the magnetic particles 91 and the magnetic particles 91 do not fall onto a bottom of the chamber 22. As a result, the coated magnetic particle 93 shown in FIG. 5 can be stably manufactured.

The first magnet roller 51, the second magnet roller 52, and the third magnet roller 53 are rotatable. A relationship of $r_1\omega_1^2 > r_2\omega_2^2 > r_3\omega_3^2$ is satisfied, in which $r_1\omega_1^2$ is a product of a rotation radius $r_1$ and a square of a rotation speed $\omega_1$ per unit time of the first magnet roller 51, $r_2\omega_2^2$ is a product of a rotation radius $r_2$ and a square of a rotation speed $\omega_2$ per unit time of the second magnet roller 52, and $r_3\omega_3^2$ is a product of a rotation radius $r_3$ and a square of the rotation speed $\omega_3$ per unit time of the third magnet roller 53.

Accordingly, among the magnetic particles 91, first magnetic particles 911 having a relatively small diameter are selectively fixed onto the first magnet roller 51, and second magnetic particles 912 and third magnetic particles 913 having a larger diameter than the first magnetic particles 911 fall downward by a centrifugal force without being fixed onto the first magnet roller 51. Similarly, between the second magnetic particles 912 and the third magnetic particles 913, the second magnetic particles 912 having a relatively small diameter are selectively fixed onto the second magnet roller 52, and the third magnetic particles 913 having a larger diameter than the second magnetic particles 912 fall downward by a centrifugal force without being fixed onto the second magnet roller 52. The fallen third magnetic particles 913 are fixed onto the third magnet roller 53.

As described above, the magnetic particles 91 are fixed at different positions in the vertical direction on a particle diameter basis. That is, the first magnetic particles 911, the second magnetic particles 912, and the third magnetic particles 913 are fixed at different positions in this order from a vertically upper side in the chamber 22 as shown in FIGS. 1 and 2. In this manner, the magnetic particles 91 can be fixed in a state in which particle diameters are uniform. As a result, when film formation is performed by the film forming unit 8 in the chamber 22, an event in which particles having a small particle diameter are hidden behind particles having a large particle diameter as in the related art is less likely to occur. Therefore, a variation in film thicknesses of the coating film 92 formed on the surfaces of the magnetic particles 91 can be reduced.

Hereinafter, each unit of the particle coating device 1 will be described in detail.

1.1 Chamber

As shown in FIGS. 1 and 2, the chamber 22 has a cylindrical shape having an axis parallel to the Z axis (a vertical axis). An upper end and a lower end of the cylinder are closed.

Examples of a constituent material of the chamber 22 include a glass material such as quartz glass, a ceramic material such as alumina, a metal material such as stainless steel, aluminum, and titanium. A material having transparency, particularly infrared transparency, may be used in the present embodiment. Accordingly, when an infrared radiation heater is used as a heating unit 28 to be described later, the magnetic particles 91 can be selectively heated. As a result, the magnetic particles 91 can be heated in a short time and the coating film 92 can be efficiently formed.

The chamber 22 is a container including a cylindrical main body portion 222 having an open upper end and an open lower end, an upper flange 224 that closes the upper end of the main body portion 222, and a lower flange 226 that closes the lower end of the main body portion 222. A shape of the chamber 22 is not limited thereto.

The upper flange 224 is a disk-shaped plate member provided in parallel to the X-Y plane, and seals the upper end of the main body portion 222. The upper flange 224 includes a powder supply port 2242 that passes through a central portion of the upper flange 224 as viewed from above. The powder supply port 2242 is a path for supplying the magnetic particles 91 from outside of the chamber 22 into the chamber 22. A valve 225 is mounted onto the powder supply port 2242. The valve 225 is formed of a vacuum gate valve or the like and opens or closes the powder supply port 2242. A powder supply unit 23 is coupled to the powder supply port 2242.

The powder supply unit 23 includes a powder storage unit 232 that stores the magnetic particles 91. The powder storage unit 232 has a hollow inverted conical shape. An inner diameter of a lower end of the powder storage unit 232 is smaller than an inner diameter of an upper end. The lower end of the powder storage unit 232 is coupled to the powder supply port 2242. When the valve 225 is opened, the magnetic particles 91 stored in the powder storage unit 232 fall into the chamber 22 by own weight of the magnetic particles 91.

The lower flange 226 is a disk-shaped plate member provided in parallel to the X-Y plane and seals the lower end of the main body portion 222. The lower flange 226 is movable upward and downward. Specifically, when the lower flange 226 is moved upward, a space between the lower flange 226 and the main body portion 222 is air-tightly sealed by an O-ring 2262. When the lower flange 226 is moved downward, the lower flange 226 can be separated from the main body portion 222, and an operation can be performed inside the main body portion 222.

A collection electromagnet 228 is provided on an upper surface of the lower flange 226. The collection electromagnet 228 fixes the manufactured coated magnetic particles 93 by a magnetic force. Accordingly, a collection operation of the coated magnetic particles 93 can be easily performed.

A vertical drive unit 229 is provided below the chamber 22. The lower flange 226 and the collection electromagnet 228 are moved up and down by the vertical drive unit 229.

The main body portion 222 includes a through hole 2222 provided in a lower portion of the main body portion 222. An exhaust unit 24 is coupled to the through hole 2222.

The exhaust unit 24 includes a valve 242 mounted onto the through hole 2222, an exhaust pump 244, and a pipe 246 that couples the valve 242 with the exhaust pump 244. The chamber 22 is exhausted by the exhaust unit 24 so that the chamber 22 can be depressurized and brought into a vacuum state.

The valve 242 is formed of a vacuum gate valve or the like and is closed to block the through hole 2222. Accordingly, gas exhaustion can be temporarily stopped, or the chamber 22 can be maintained in the vacuum state.

The heating unit 28 is provided on an outer peripheral side of a side wall of the main body portion 222 so as to surround the main body portion 222. The heating unit 28 heats the magnetic particles 91 accommodated in the chamber 22 from the outer side of the chamber 22 to raise temperature.

A heating principle and an arrangement of the heating unit 28 are not particularly limited as long as the heating unit 28 is a device capable of heating the magnetic particles 91 accommodated in the chamber 22. The heating unit 28 according to the present embodiment is an infrared radiation heater that emits infrared ray (IR). Accordingly, the magnetic particles 91 can be heated in a shorter time by the infrared ray (IR). In FIG. 2, a part of the heating unit 28 is omitted.

1.2 Film Forming Unit

The film forming unit 8 according to the present embodiment forms the coating film 92 on the surfaces of the magnetic particles 91 by an atomic layer deposition (ALD) method.

The film forming unit 8 includes a gas introduction unit 82. In the film forming unit 8, a gas is introduced by the gas introduction unit 82. Thereafter, the magnetic particles 91 are heated by the heating unit 28 described above. A raw material gas introduced into the chamber 22 is thermally decomposed on the surfaces of the magnetic particles 91 by the heating. The decomposed substances adhere to the surfaces of the magnetic particles 91. Accordingly, the coating film 92 is formed finally.

The gas introduction unit 82 includes a support member 822 coupled to an upper portion of the gas introduction unit 82, nozzles 823 and 824 provided inside the support member 822, a raw material gas storage unit 825 that stores the raw material gas as a coating material, an oxidant storage unit 826 that stores an oxidant, a pipe 827 that couples the raw material gas storage unit 825 and the nozzle 823, and a pipe 828 that couples the oxidant storage unit 826 and the nozzle 824. The gas introduction unit 82 supplies the raw material gas, the oxidant, and the like that are necessary for forming the coating film 92 into the chamber 22.

The support member 822 has a bottomed cylindrical shape having an axis parallel to the X axis. An opening of the support member 22 is coupled to the chamber 22. Accordingly, a closed space is formed between the inside of the support member 822 and the chamber 22. When the coating film 92 is formed, the closed space is in a depressurized state.

The nozzle 823 is provided inside the support member 822 and sprays the raw material gas sent via the pipe 827 into the chamber 22. The nozzle 824 is also provided inside the support member 822 and sprays the oxidant sent via the pipe 828 into the chamber 22. Accordingly, the raw material gas and the oxidant are supplied into the chamber 22.

Valves that adjust flow rates of the raw material gas and the oxidant are respectively provided in the middle of the pipes 827 and 828, and control partial pressures of the raw material gas and the oxidant in the chamber 22.

The raw material gas and the oxidant are supplied together with a carrier gas containing an inert gas such as a nitrogen gas or an argon gas as a main component as needed.

With the film forming unit 8 according to the present embodiment, the coating film 92 is formed by the atomic layer deposition method as described above. In the atomic layer deposition method, two or more types of materials including the raw material gas and the oxidant are alternately and repeatedly introduced and exhausted so that raw material molecules adhered to the surfaces of the magnetic particles 91 are reacted to form a film. With this method, a film thickness of the coating film 92 to be formed can be controlled with high accuracy. Accordingly, the particularly thin coating film 92 can be formed. Therefore, in a case in which the magnetic particles 91 have soft magnetism, if the film thickness of the coating film 92 coating the surfaces of the magnetic particles 91 can be reduced, good insulation among the magnetic particles 91 can be maintained and dust cores of the magnetic particles 91 having a high powder density can be manufactured. Accordingly, it is possible to implement the coated magnetic particles 93 capable of manufacturing a dust core or the like having a high magnetic characteristic particularly such as magnetic flux density and magnetic permeability.

Since the raw material gas and the oxidant flow around even in a fine gap so that the film is formed, a portion where the film is not formed, that is, a pinhole is less likely to occur, and the coating film 92 having a uniform film thickness can be formed. Therefore, the coated magnetic particles 93 can be obtained by coating the surfaces of the magnetic particles 91 with the coating film 92 having a uniform and thin film thickness. The coated magnetic particles 93 contribute to implementation of a dust core having good insulation among particles.

Although the film forming unit 8 according to the present embodiment uses the atomic layer deposition (ALD) method as a film forming method, the film forming method of the film forming unit 8 is not limited thereto, and may be a sputtering method, a vacuum deposition method, a chemical vapor deposition (CVD) method, or the like.

1.3 Rotation Introducer

As shown in FIGS. 2 and 3, the first rotation introducer 41 includes a hollow shaft 412, a flange portion 414, and a seal portion 416.

As shown in FIG. 2, the hollow shaft 412 is a rod-shaped member having a long axis along the Y axis, and passes through the inner side and the outer side of the chamber 22 by passing through a side wall of the main body portion 222 of the chamber 22. The hollow shaft 412 is hollow and a wire 516 or the like to be described later can be inserted into the hollow shaft 412.

As shown in FIG. 3, of two end portions of the hollow shaft 412, the flange portion 414 is provided at the end portion inside the main body portion 222. The flange portion 414 is air-tightly coupled with the first magnet roller 51 to be described later via an O-ring 4142.

As shown in FIG. 3, the seal portion 416 has a cylindrical shape having an axis along the Y axis and is coupled to an outer surface of the main body portion 222 of the chamber 22. Specifically, the seal portion 416 and the main body portion 222 are air-tightly coupled via an O-ring 4162. The hollow shaft 412 is inserted into the seal portion 416. An outer surface of the hollow shaft 412 and the seal portion 416 are also air-tightly sealed by magnetic fluid, oil, or the like. Examples of the seal portion 416 include various dynamic vacuum seals such as a magnetic fluid seal, an oil seal, an O-ring seal, a bellows seal, and a magnet coupling seal.

When a rotation drive force is applied from outside of the chamber 22 to the hollow shaft 412 by the first drive unit 61 to be described later, the first rotation introducer 41 transmits the rotation drive force to the inside of the chamber 22 without damaging the vacuum state of the chamber 22. Accordingly, the first magnet roller 51 coupled to the first rotation introducer 41 can be rotated. Electric power required for the first magnet roller 51 can be supplied from the outside of the chamber 22 by using the hollow shaft 412.

As shown in FIG. 2, the second rotation introducer 42 is provided below the first rotation introducer 41. As shown in FIG. 2, the third rotation introducer 43 is provided below the second rotation introducer 42.

The second rotation introducer 42 includes a hollow shaft 422 and the third rotation introducer 43 includes a hollow shaft 432. Other than that, the second rotation introducer 42 and the third rotation introducer 43 have similar configurations as the first rotation introducer 41.

As described above, at least one of the first rotation introducer 41 and the second rotation introducer 42 includes the hollow shaft 412 or the hollow shaft 422 that is hollow. As described above, the hollow shaft 412 and the hollow shaft 422 are provided so that a wire or the like can be inserted into the first rotation introducer 41 and the second rotation introducer 42. Accordingly, the first rotation introducer 41 and the second rotation introducer 42 can also provide paths for drawing the wire or the like into the chamber 22 while maintaining a function of transmitting a rotation drive force. As a result, an electromagnet 514, for example, can be energized.

1.4 Magnet Roller

The first magnet roller 51 is provided inside the chamber 22 and is coupled to the first rotation introducer 41. As shown in FIGS. 2 and 3, the first magnet roller 51 includes an exterior member 512, the electromagnet 514, and the wire 516.

As shown in FIG. 3, the exterior member 512 is a cylindrical member having an axis along the Y axis, and two end portions of the exterior member 512 are closed. However, a through hole is provided at a central portion of the end portion of the exterior member 512 at a positive side of the Y axis. The wire 516 that electrically couples the electromagnet 514 with a first energization unit 64 to be described later is inserted into the through hole.

The electromagnet 514 is provided inside the exterior member 512 and generates a magnetic field on a surface of the first magnet roller 51. Accordingly, the magnetic particles 91 can be fixed onto the surface of the first magnet roller 51 by a magnetic force.

One or a plurality of electromagnets 514 are provided inside the exterior member 512. That is, the first magnet roller 51 is an electromagnetic roller. Accordingly, the magnetic field generated by the first magnet roller 51 can be easily controlled. Therefore, an operation such as fixing the magnetic particles 91 or unfixing the magnetic particles 91 can be easily performed. When a plurality of electromagnets 514 are provided, an arrangement of the electromagnets 514 is not particularly limited. For example, the electromagnets 514 are arranged annularly in a circumferential direction of the exterior member 512.

Examples of a constituent material of the exterior member 512 include a metal material having high magnetic permeability and an iron-based alloy material such as electromagnetic stainless steel.

The electromagnet 514 may be replaced by a permanent magnet. In this case, the energization unit to be described later may be omitted or the hollow shaft 412 described above may be a solid shaft.

As shown in FIG. 2, the second magnet roller 52 is provided below the first magnet roller 51 in the vertical direction in the chamber 22, and is coupled to the second rotation introducer 42. As shown in FIG. 2, the third magnet roller 53 is provided below the second magnet roller 52 in the vertical direction in the chamber 22, and is coupled to the third rotation introducer 43.

The second magnet roller 52 and the third magnet roller 53 have the same configurations as the first magnet roller 51. Therefore, the second magnet roller 52 and the third magnet roller 53 are electromagnetic rollers. Accordingly, magnetic fields generated by the second magnet roller 52 and the third magnet roller 53 can be easily controlled.

1.5 Drive Unit

As shown in FIGS. 2 to 4, the first drive unit 61 is coupled to the first rotation introducer 41. Specifically, as shown in FIGS. 2 and 3, the first drive unit 61 is provided outside the chamber 22. Of the two end portions of the hollow shaft 412, the first drive unit 61 is coupled to the end portion outside the main body portion 222.

As shown in FIG. 3, the first drive unit 61 includes a motor 612 and a chain 614.

The motor 612 generates a rotation drive force based on a control signal output from the control unit 7 to be described later. The rotation drive force is applied to the hollow shaft 412 via the chain 614. Then, the first magnet roller 51 can be rotated under a desired condition via the hollow shaft 412 and the flange portion 414.

The chain 614 transmits the rotation drive force between an output shaft of the motor 612 and the hollow shaft 412. The chain 614 may be replaced with a belt, a gear system, or the like. When the motor 612 and the hollow shaft 412 are directly coupled with each other, the chain 614 may be omitted.

As shown in FIG. 2, the second drive unit 62 is coupled to the second rotation introducer 42. As shown in FIG. 2, the third drive unit 63 is coupled to the third rotation introducer 43.

The second drive unit 62 and the third drive unit 63 have the same configurations as the first drive unit 61.

1.6 Energization Unit

As shown in FIG. 4, the first energization unit 64 is electrically coupled to the first magnet roller 51 via the first rotation introducer 41. Specifically, as shown in FIG. 3, the first energization unit 64 is provided outside the chamber 22. Of the two end portions of the hollow shaft 412, the first energization unit 64 is coupled to the end portion outside the main body portion 222. The wire 516 inserted into the hollow shaft 412 is coupled to the first energization unit 64. In this manner, the wire 516 is electrically coupled between the electromagnet 514 and the first energization unit 64. An insulator may be provided inside the hollow shaft 412 as needed.

The first energization unit 64 uses a connector for rotational coupling, such as a slip ring. The connector for rotational coupling can maintain energization to the wire 516 even when the hollow shaft 412 into which the wire 516 is inserted is rotated.

As shown in FIG. 4, a second energization unit 65 is electrically coupled to the second magnet roller 52 via the second rotation introducer 42. As shown in FIG. 4, a third energization unit 66 is electrically coupled to the third magnet roller 53 via the third rotation introducer 43.

The second energization unit 65 and the third energization unit 66 have the same configurations as the first energization unit 64.

1.7 Control Unit

The control unit 7 includes an input reception unit 71, a drive condition determination unit 72, an energization condition determination unit 73, and a storage unit 74.

The input reception unit 71 receives, from a user, an input including the rotation radius $r_1$ of the first magnet roller 51, the rotation radius $r_2$ of the second magnet roller 52, and the rotation radius $r_3$ of the third magnet roller 53. The input reception unit 71 may have a function of receiving an input of information other than the rotation radii. An example of such information includes a particle diameter distribution of the magnetic particles 91. The input information is stored in the storage unit 74.

The drive condition determination unit 72 determines rotation drive conditions for magnet rollers driven by the first drive unit 61, the second drive unit 62, and the third drive unit 63 based on the information stored in the storage unit 74. That is, the control unit 7 controls an operation of the first drive unit 61, an operation of the second drive unit 62, and an operation of the third drive unit 63. A method for determining a rotation drive condition will be described later.

The energization condition determination unit 73 determines energization conditions for the first magnet roller 51, the second magnet roller 52, and the third magnet roller 53. The energization conditions are set appropriately so that a strength of an electric field generated on a surface of each magnet roller can be controlled.

The functions of the control unit 7 described above can be implemented by a hardware configuration including a processor such as a central processing unit (CPU), a memory such as a read only memory (ROM) and a random access memory (RAM), an external interface, and an input device such as a keyboard and a keypad. These units are communicably coupled to each other via a bus. The control unit 7 implements the functions described above by the processor appropriately reading data stored in the memory and executing programs stored in the memory.

1.8 Magnetic Particle

Next, the magnetic particles 91 will be described.

The magnetic particles 91 may be particles having hard magnetism and particles having soft magnetism. Since magnetization of particles can be controlled by the presence or absence of a magnetic field, the particles having soft magnetism can be switched between being fixed and being unfixed by the presence or absence of magnetic fields generated by the first magnet roller 51, the second magnet roller 52, and the third magnet roller 53. Therefore, formation of the coating film 92 on the magnetic particles 91, transportation of the coated magnetic particles 93, or the like can be easily performed.

Examples of a constituent material of the magnetic particles 91 include various Fe-based alloys such as a Fe—Si-based alloy such as pure iron and silicon steel, a Fe—Ni-based alloy such as permalloy, a Fe—Co-based alloy such as permendur, a Fe—Si—Al-based alloy such as sendust, and a Fe—Cr—Si-based alloy, various Ni-based alloys, various Co-based alloys, and various amorphous alloys. Examples of the amorphous alloys include Fe-based alloys such as a Fe—Si—B-based alloy, a Fe—Si—B—C-based alloy, a Fe—Si—B—Cr—C-based alloy, a Fe—Si—Cr-based alloy, a Fe—B-based alloy, a Fe—P—C-based alloy, a Fe—Co—Si—B-based alloy, a Fe—Si—B—Nb-based alloy, and a Fe—Zr—B-based alloy, Ni-based alloys such as a Ni—Si—B-based alloy and a Ni—P—B-based alloy, and a Co-based alloy such as a Co—Si—B-based alloy.

An average particle diameter of the magnetic particles 91 is not particularly limited, and is preferably 50 μm or less, more preferably 1 μm or more and 30 μm or less, and even more preferably 2 μm or more and 20 μm or less. Such relatively small magnetic particles 91 are useful as magnetic particles for a dust core because an eddy current loss can be reduced when the magnetic particles 91 have soft magnetism.

1.9 Particle Coating Method

Next, a method (a particle coating method) for forming the coating film 92 on the surfaces of the magnetic particles 91 by using the particle coating device 1 will be described.

Figure 6:
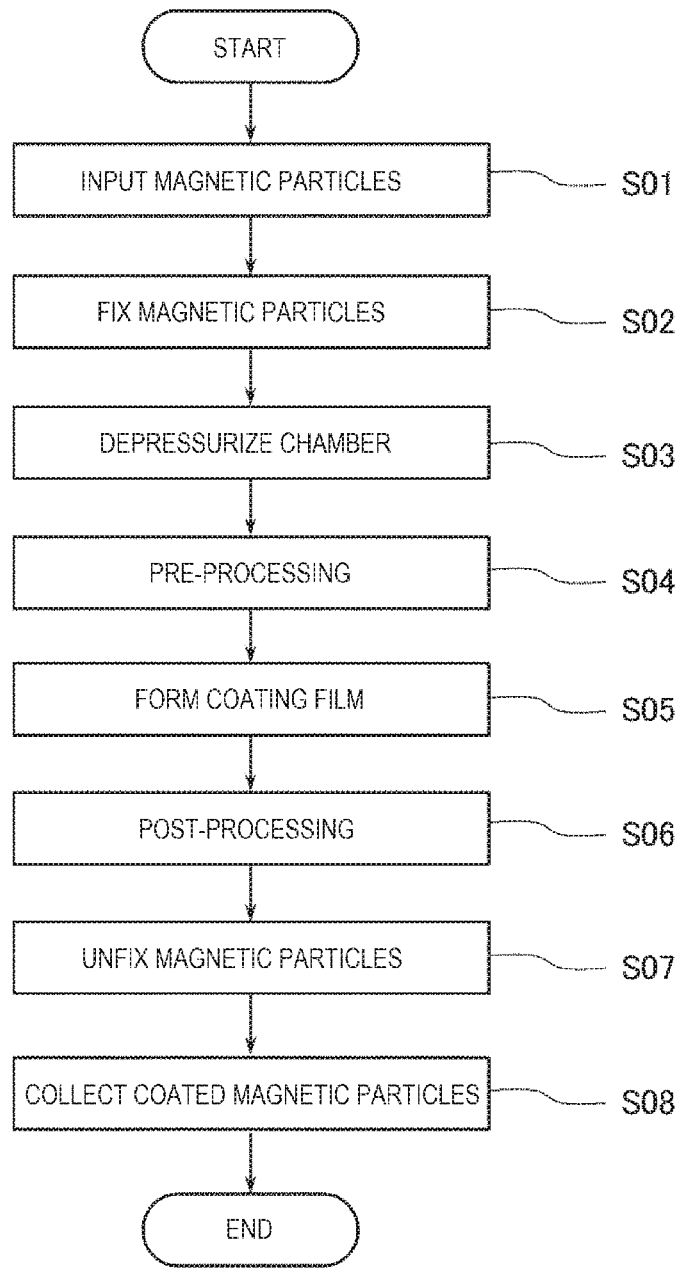
FIG. 6 is a step diagram showing a particle coating method.

FIG. 6 is a step diagram showing the particle coating method. FIGS. 7 to 10 are diagrams separately showing the particle coating method shown in FIG. 6.

1.9.1 Input Magnetic Particles S01

First, the magnetic particles 91 are input into the powder storage unit 232. The magnetic particles 91 include the first magnetic particles 911 having a relatively small diameter, the second magnetic particle 912 having a relatively medium diameter, and the third magnetic particle 913 having a relatively large diameter. The first magnetic particles 911, the second magnetic particles 912, and the third magnetic particles 913 represent particle diameters of three stages corresponding to an example of a particle diameter distribution model of the magnetic particles 91. When the magnetic particles 91 are input, the valve 225 is closed.

1.9.2 Fix Magnetic Particles S02

Next, the first magnet roller 51, the second magnet roller 52, and the third magnet roller 53 are energized to generate magnetic fields after the valve 242 is closed. The first drive unit 61, the second drive unit 62, and the third drive unit 63 rotate respective magnet rollers.

Figure 7:
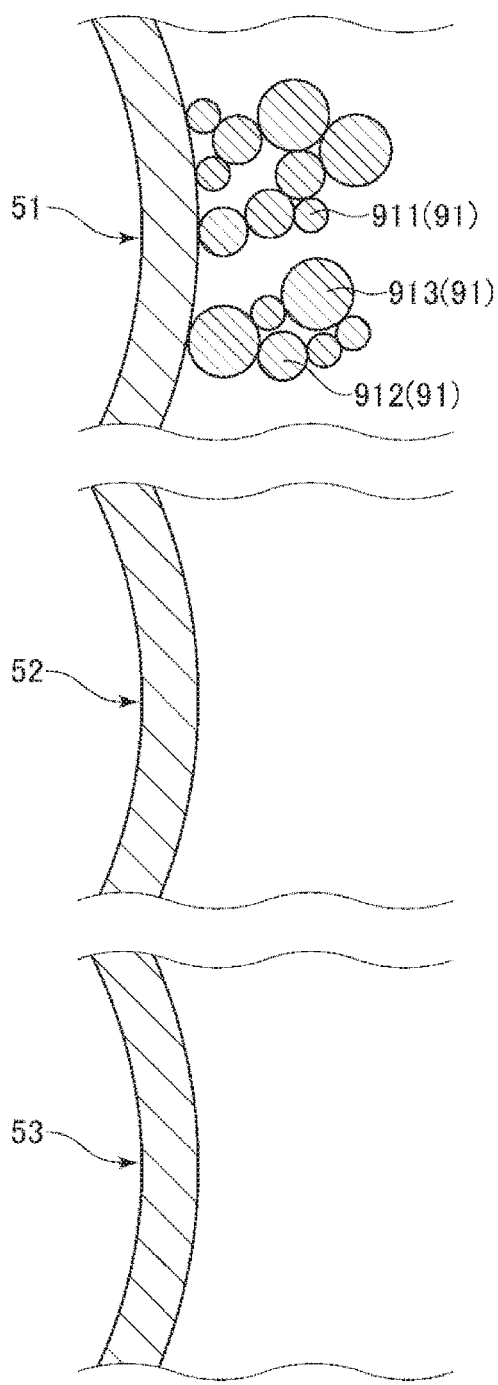
FIG. 7 is a diagram showing the particle coating method shown in FIG. 6.

In such a state, the valve 225 is opened so that the magnetic particles 91 fall into the chamber 22. Then, the falling magnetic particles 91, that is, the first magnetic particles 911, the second magnetic particles 912, and the third magnetic particles 913, are fixed onto the first magnet roller 51 as shown in FIG. 7 by a magnetic field generated by the first magnet roller 51 that is located directly below the valve 225. Accordingly, the first magnet roller 51 is rotated in a state in which the first magnetic particles 911, the second magnetic particles 912, and the third magnetic particles 913 are fixed.

Here, a relationship of $\varphi 1 < \varphi 2 < \varphi 3$ is satisfied in which a particle diameter of the first magnetic particles 911 is $\varphi 1$, a particle diameter of the second magnetic particles 912 is $\varphi 2$, and a particle diameter of the third magnetic particles 913 is $\varphi 3$. Therefore, a relationship of $m1 < m2 < m3$ is satisfied in which a mass of the first magnetic particles 911 is m1, a mass of the second magnetic particles 912 is m2, and a mass of the third magnetic particles 913 is m3.

A centrifugal force separately acts on the first magnetic particles 911, the second magnetic particles 912, and the third magnetic particles 913 that are fixed onto the first magnet roller 51 and the centrifugal force is proportional to a mass. Therefore, a relationship of F11<F12<F13 is satisfied in which a centrifugal force acting on the first magnetic particles 911 is F11, a centrifugal force acting on the second magnetic particles 912 is F12, and a centrifugal force acting on the third magnetic particles 913 is F13.

For example, the centrifugal force F11 acting on the first magnetic particles 911 is proportional to the mass m1 of the first magnetic particles 911, the rotation radius $r_1$ of the first magnet roller 51, and a square of the rotation speed $\omega_1$ per unit time of the first magnet roller 51. Similarly, the centrifugal force F12 acting on the second magnetic particles 912 is proportional to the mass m2 of the second magnetic particles 912, the rotation radius $r_1$ of the first magnet roller 51, and the square of the rotation speed $\omega_1$ per unit time of the first magnet roller 51, and the centrifugal force F13 acting on the third magnetic particles 913 is proportional to the mass m3 of the third magnetic particles 913, the rotation radius $r_1$ of the first magnet roller 51, and the square of the rotation speed $\omega_1$ per unit time of the first magnet roller 51.

Among the above parameters, the rotation radius $r_1$ may be changed, and the rotation speed $\omega_1$ per unit time can be relatively easily changed under the control of the control unit 7. Since the centrifugal forces F11, F12, and F13 are proportional to the square of the rotational speed $\omega_1$ per unit time, the centrifugal forces F11, F12, and F13 can be greatly changed by changing the rotational speed $\omega_1$ per unit time as compared with a case of changing other parameters.

Based on this, when the control unit 7 determines a rotation drive condition for the first magnet roller 51, the control unit 7 determines the rotation speed $\omega_1$ per unit time so that a relationship of M11>F11 is satisfied in which a magnetic force for fixing the first magnetic particles 911 onto the first magnet roller 51 is M11. The rotation speed $\omega_1$ per unit time is determined so that both relationships of M12<F12 and M13<F13 are satisfied in which a magnetic force for fixing the second magnetic particles 912 onto the first magnet roller 51 is M12 and a magnetic force for fixing the third magnetic particles 913 onto the first magnet roller 51 is M13.

In this manner, the first magnetic particles 911 can continue being fixed along with rotation of the first magnet roller 51. On the other hand, the second magnetic particles 912 and the third magnetic particles 913 are detached from the first magnet roller 51 since the centrifugal forces F12 and F13 are larger than the magnetic forces M12 and M13. As a result, the first magnetic particles 911 selectively remain on the first magnet roller 51, and the second magnetic particles 912 and the third magnetic particles 913 fall vertically downward the first magnet roller 51.

Figure 8:
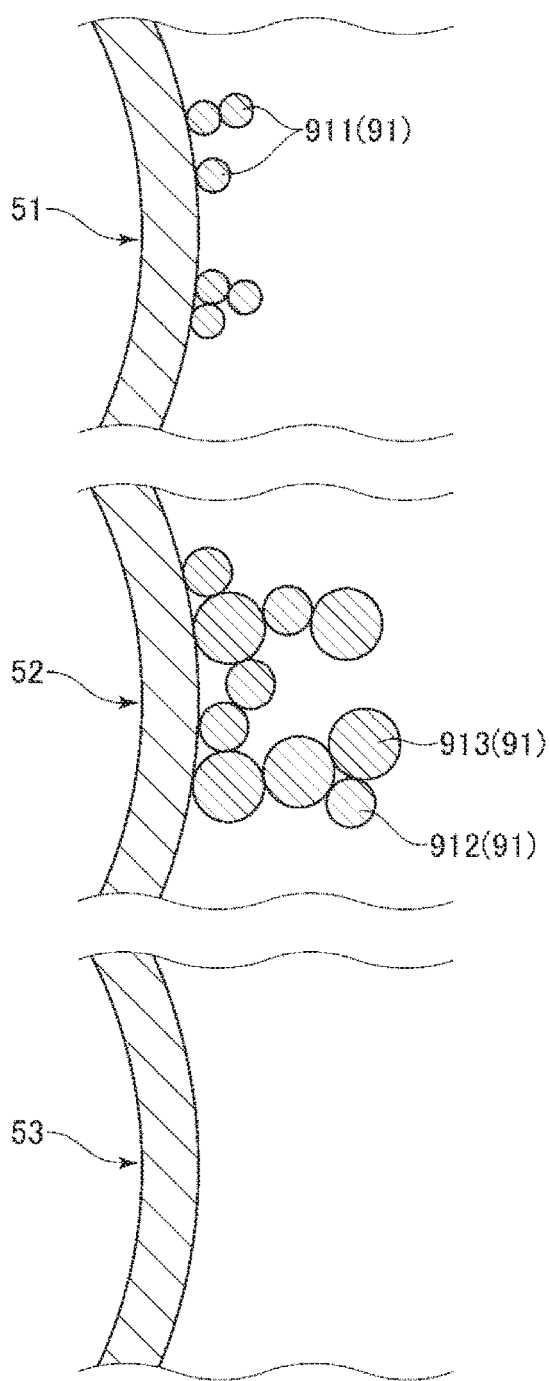
FIG. 8 is a diagram showing the particle coating method shown in FIG. 6.

As shown in FIG. 8, the second magnetic particles 912 and the third magnetic particles 913 are fixed onto the second magnet roller 52. Accordingly, the second magnet roller 52 is rotated in a state in which the second magnetic particles 912 and the third magnetic particles 913 are fixed.

Here, a rotation drive condition of the first magnet roller 51 and a rotation drive condition of the second magnet roller 52 can be set independently of each other by the first drive unit 61 and the second drive unit 62. In the present embodiment, a relationship of $r_1\omega_1^2 > r_2\omega_2^2$ is satisfied in which $r_1\omega_1^2$ is a product of the rotation radius $r_1$ and a square of the rotation speed $\omega_1$ per unit time of the first magnet roller 51 and $r_2\omega_2^2$ is a product of the rotation radius $r_2$ and a square of the rotation speed $\omega_2$ per unit time of the second magnet roller 52.

Such a difference between the rotation drive condition of the first magnet roller 51 and the rotation drive condition of the second magnet roller 52 is provided so that the second magnetic particles 912 and the third magnetic particles 913 that fall down and are not fixed onto the first magnet roller 51 can be fixed onto the second magnet roller 52. Accordingly, at least the first magnetic particles 911 and the second magnetic particles 912 can be classified based on particle diameters and can be fixed onto the first magnet roller 51 or the second magnet roller 52 in a classified state. In the present specification, such classification based on particle diameters is also referred to as a "classification operation".

The rotation radius $r_1$ of the first magnet roller 51 refers to a radius of a circle corresponding to an outer circumferential surface of the first magnet roller 51 when the first magnet roller 51 is cut in a plane orthogonal to a rotation axis. When the rotation radius $r_1$ changes along the rotation axis, a radius of a circle in the middle of a length of the first magnet roller 51 along the rotation axis is defined as the rotation radius $r_1$. The same applies to the rotation radius $r_2$ of the second magnet roller 52 and the rotation radius $r_3$ of the third magnet roller 53.

The circle corresponding to the outer circumferential surface may be a perfect circle. Alternatively, the circle corresponding to the outer circumferential surface may be figures such as an ellipse and a polygon. In this case, the rotation radii $r_1$, $r_2$, and $r_3$ are radii of inscribed circles of the figures.

A relationship of F22<F23 is satisfied in which F22 is a centrifugal force acting on the second magnetic particles 912 that are fixed onto the second magnet roller 52 and F23 is a centrifugal force acting on the third magnetic particles 913.

When the control unit 7 determines a rotation drive condition of the second magnet roller 52, the control unit 7 determines the rotation speed $\omega_2$ per unit time so that a relationship of M22>F22 is satisfied in which M22 is a magnetic force for fixing the second magnetic particles 912 onto the second magnet roller 52. The rotation speed $\omega_2$ per unit time is determined so that a relationship of M23<F23 is satisfied in which M23 is a magnetic force for fixing the magnetic particles 913 onto the second magnet roller 52. In this manner, the second magnetic particles 912 can continue being fixed along with rotation of the second magnet roller 52. On the other hand, the third magnetic particles 913 are detached from the second magnet roller 52 since the centrifugal force F23 is larger than the magnetic force M23. As a result, the second magnetic particles 912 selectively remain on the second magnet roller 52, and the third magnetic particles 913 fall vertically downward the second magnet roller 52.

Figure 9:
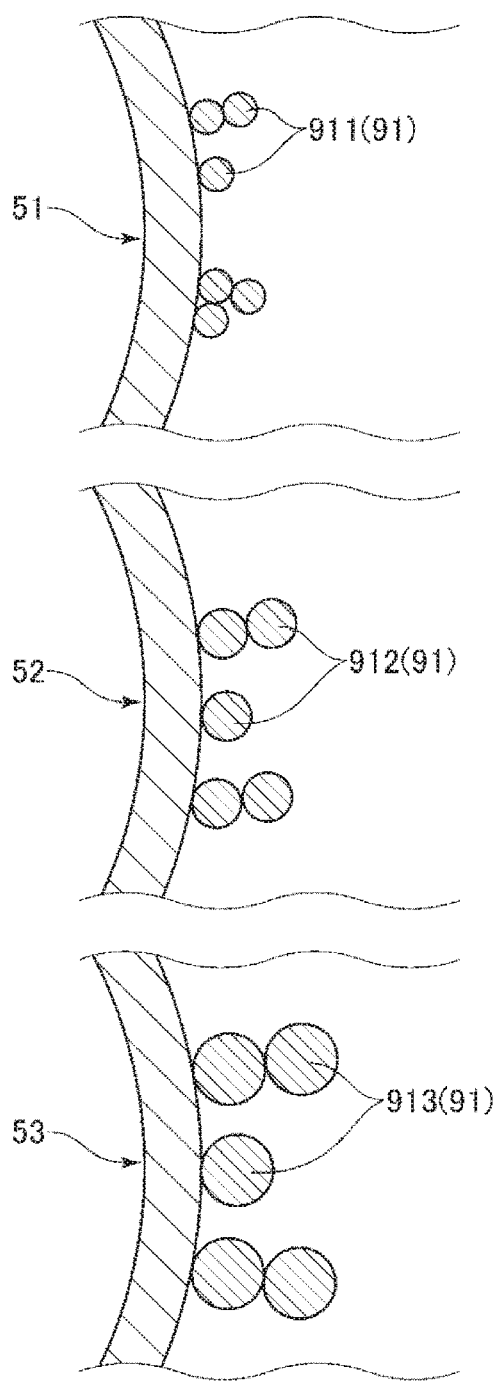
FIG. 9 is a diagram showing the particle coating method shown in FIG. 6.

As shown in FIG. 9, the third magnetic particles 913 are fixed onto the third magnet roller 53. Accordingly, the third magnet roller 53 is rotated in a state in which the third magnetic particles 913 are fixed.

Here, a rotation drive condition of the second magnet roller 52 and a rotation drive condition of the third magnet roller 53 can be set independently of each other by the second drive unit 62 and the third drive unit 63. In the present embodiment, a relationship of $r_2\omega_2^2 > r_3\omega_3^2$ is satisfied in which $r_3\omega_3^2$ is a product of the rotation radius $r_3$ and a square of the rotation speed $\omega_3$ per unit time of the third magnet roller 53.

Such a difference between the rotation drive condition of the second magnet roller 52 and the rotation drive condition of the third magnet roller 53 is provided so that the third magnetic particles 913 that fall down and are not fixed onto the second magnet roller 52 can be fixed onto the third magnet roller 53. Accordingly, the second magnetic particles 912 and the third magnetic particles 913 can be classified based on particle diameters and can be fixed onto the second magnet roller 52 or the third magnet roller 53 in a classified state.

As described above, the first magnetic particles 911, the second magnetic particles 912, and the third magnetic particles 913 can be classified based on particle diameters and can be fixed in a classified state. That is, the first magnetic particles 911 are selectively fixed onto the first magnet roller 51, the second magnetic particles 912 are selectively fixed onto the second magnet roller 52, and the third magnetic particles 913 are selectively fixed onto the third magnet roller 53. Therefore, the drive condition determination unit 72 in the control unit 7 may appropriately determine rotation drive conditions for the first drive unit 61, the second drive unit 62, and the third drive unit 63 so as to perform the classification operation as described above.

An ideal classification operation has been described above. Therefore, in practice, the second magnetic particles 912 or the third magnetic particles 913 may be fixed onto the first magnet roller 51, the first magnetic particles 911 or the third magnetic particles 913 may be fixed onto the second magnet roller 52, and the first magnetic particles 911 or the second magnetic particles 912 may be fixed onto the third magnet roller 53. In this case, an existence ratio of particles fixed in such an unintentional manner may be lower than an existence ratio of particles fixed as described above.

On the other hand, the energization condition determination unit 73 in the control unit 7 determines energization conditions for the first magnet roller 51, the second magnet roller 52, and the third magnet roller 53. The energization condition determination unit 73 may determine different energization conditions for the magnet rollers, or may determine the same energization condition for the magnet rollers. When the energization condition determination unit 73 determines the same energization condition for the magnet rollers, the classification operation may be performed mainly based on the rotation drive conditions. Therefore, the operation is relatively easily performed and classification accuracy is likely to be increased.

1.9.3 Depressurize Chamber S03

Next, after the valve 225 is closed, the valve 242 is opened and the chamber 22 is exhausted by the exhaust pump 244. Accordingly, the chamber 22 is depressurized and brought into a vacuum state. At this time, particularly when the exhaust pump 244 is operated, the magnetic particles 91 may fly up since air inside the chamber 22 is stirred rapidly. However, the magnetic particles 91 are prevented from flying up in the present embodiment since the magnetic particles 91 are fixed onto the first magnet roller 51, the second magnet roller 52, or the third magnet roller 53 as described above. Therefore, a failure of the exhaust pump 244 and a loss of the magnetic particles 91 caused by the magnetic particles 91 flying up can be prevented.

When the chamber 22 reaches a target pressure by exhaustion, the valve 242 is closed.

1.9.4 Pre-Processing S04

Next, the magnetic particles 91 fixed in the chamber 22 are subjected to a pre-processing. Examples of the pre-processing include an ozone processing, a radical processing, an ultraviolet processing, a plasma processing, a corona processing, a heating processing, a drying processing, and a solvent processing.

Among the processings, the pre-processing may include a processing of oxidizing the surfaces of the magnetic particles 91 or a processing of drying the magnetic particles 91. In the processing of oxidizing the surfaces of the magnetic particles 91, an oxide film can be formed on the surfaces of the magnetic particles 91, or an existing oxide film can be enhanced. Accordingly, in terms of forming the coating film 92 to be described later, the coating film 92 can be formed uniformly since adhesion of the raw material gas is facilitated.

Examples of the processing of oxidizing the surfaces of the magnetic particles 91 include an ozone processing and a radical processing. In the ozone processing, an ozone gas is introduced into the chamber 22. In the radical processing, hydrogen peroxide is introduced into the chamber 22 to generate a hydroxyl radical.

In a processing of drying the magnetic particles 91, moisture adhered to the surfaces of the magnetic particles 91 is removed. The moisture may inhibit formation of the coating film 92 to be described later. Therefore, adhesion of the coating film 92 can be improved by removing the moisture in the pre-processing. Examples of the processing of drying the magnetic particles 91 include a processing of heating the magnetic particles 91, a drying processing of exposing the magnetic particles 91 to a dehydrated gas, and a solvent processing of exposing the magnetic particles 91 to a water-soluble solvent such as alcohol.

The magnetic particles 91 fixed by a magnetic force as described above are distributed in a manner in which a plurality of magnetic particles 91 are continuous and are aligned in a so-called needle shape. Therefore, there are many gaps around the magnetic particles 91. As a result, even in a state in which a large number of magnetic particles 91 are locally fixed, the pre-processing can be performed uniformly and efficiently through the gaps.

The present step may be performed while rotating the first magnet roller 51, the second magnet roller 52, and the third magnet roller 53. Accordingly, the pre-processing can be performed more uniformly on the magnetic particles 91.

Thereafter, the inside of the chamber 22 is replaced with an inert gas such as a nitrogen gas and an argon gas as needed, and then the chamber 22 is exhausted again by the exhaust pump 244.

The pre-processing may be performed as needed or may be omitted.

1.9.5 Form Coating Film S05

Next, the valve 242 is closed and the chamber 22 is sealed off. In such a state, the raw material gas, that is, a precursor is introduced into the chamber 22. The raw material gas adheres to the surfaces of the magnetic particles 91. At this time, when the raw material gas adheres to the surfaces of the magnetic particles 91, it is less likely to adhere multiple layers of the raw material gas on the surfaces of the magnetic particles 91. Therefore, a film thickness of the final coating film 92 can be controlled with high accuracy. In addition, the raw material gas is also adhered to a portion on the back or in a gap by flowing around the back or the gap.

Temperature in the chamber 22 is appropriately set according to compositions of the raw material gas and the oxidant, and is preferably 50° C. or more and 500° C. or less and more preferably 100° C. or more and 400° C. or less, for example.

Pressure in the chamber 22 is set to, for example, 100 Pa or less.

An example of the raw material gas includes a gas containing a precursor of the coating film 92. Specifically, when to form the silicon-based coating film 92, examples of the raw material gas include a secondary amine such as dimethylamine, methylethylamine, and diethylamine, and a reaction product of the secondary amine and a trihalosilane such as trisdimethylaminosilane, bisdiethylaminosilane, and bischartibutylaminosilane.

Next, after the valve 242 is opened and the raw material gas is discharged, an inert gas is introduced as needed. Accordingly, the raw material gas is replaced.

Next, after the valve 242 is closed, an oxidant is introduced into the chamber 22. Examples of the oxidant include ozone, plasma oxygen, and water vapor.

The oxidant reacts with the raw material gas adhered to the surfaces of the magnetic particles 91 and the coating film 92 is formed. Similar to the raw material gas, since the oxidant also flows around a portion on the back or in a gap, the film thickness of the coating film 92 can be uniformly controlled with high accuracy.

Next, after the valve 242 is opened and the oxidant is discharged, an inert gas is introduced as needed and the oxidant is replaced.

Figure 10:
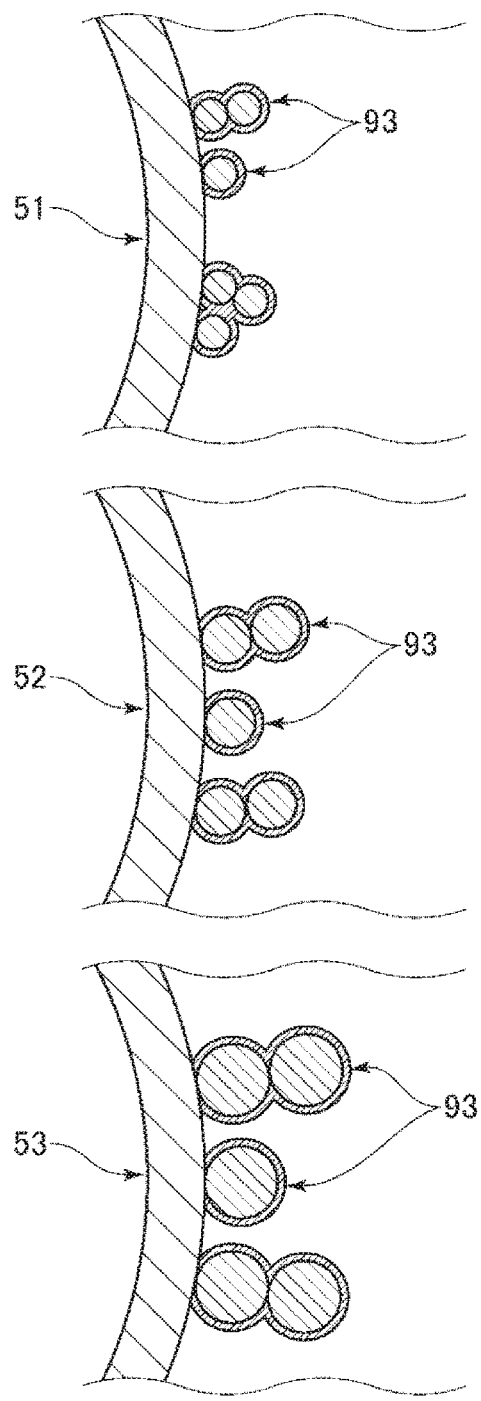
FIG. 10 is a diagram showing the particle coating method shown in FIG. 6.

In this manner, the coated magnetic particles 93 as shown in FIG. 10 are obtained. Examples of the coating film 92 to be formed include an oxide such as a silicon oxide, a hafnium oxide, a tantalum oxide, and a titanium oxide, and a nitride such as an aluminum nitride, a titanium nitride, and a tantalum nitride.

The film thickness of the coating film 92 is not particularly limited. For example, the film thickness of the coating film 92 is preferably 1 nm or more and 500 nm or less, and more preferably 2 nm or more and 100 nm or less. The coating film 92 having such a film thickness can be uniformly formed in a relatively short time.

Processings of introducing or discharging the raw material gas, introducing or discharging the oxidant, introducing or discharging the inert gas may be performed while separately rotating the first magnet roller 51, the second magnet roller 52, and the third magnet roller 53. Accordingly, the processings can be performed more uniformly on the magnetic particles 91.

When the coating film 92 is formed, the magnetic particles 91 are heated by the heating unit 28. Accordingly, the raw material gas introduced into the chamber 22 is thermally decomposed, and decomposition substances are adhered to the surfaces of the magnetic particles 91, so that finally the coating film 92 can be formed uniformly.

Heating temperature at this time is appropriately set according to compositions of the raw material gas or the like. For example, the heating temperature is preferably 50° C. or more and 500° C. or less, and more preferably 100° C. or more and 400° C. or less.

1.9.6 Post-Processing S06

Next, the coated magnetic particles 93 in the chamber 22 are subjected to a post-processing. Examples of the post-processing include a discharge processing and a radical processing.

Of the post-processings, the discharge processing is a processing of reducing an amount of charge due to charging of the coated magnetic particles 93. Aggregation and adhesion due to charging of the coated magnetic particles 93 can be prevented by performing such a discharge processing. Therefore, when the coating film 92 is formed again on the coated magnetic particles 93, which will be described later, a film formation failure due to unintentional aggregation can be prevented from occurring. For example, an ionizer is used in the discharge processing.

The post-processing described above may also be performed while separately rotating the first magnet roller 51, the second magnet roller 52, and the third magnet roller 53.

The post-processing may be performed as needed, or may be omitted.

If the film thickness of the coating film 92 is insufficient, the coating film 92 is formed again on the coated magnetic particles 93. The coating film 92 that satisfies a target film thickness can be formed by stacking a plurality of layers of the coating films 92.

1.9.7 Unfix Magnetic Particles S07

Thereafter, when the film thickness of the coating film 92 is sufficient, energization to the first magnet roller 51, the second magnet roller 52, and the third magnet roller 53 is stopped after the valve 242 is closed. Accordingly, since a magnetic force disappears, the coated magnetic particles 93 are unfixed. As a result, the coated magnetic particles 93 fall onto the bottom of the chamber 22.

Before the energization is stopped, the magnetic particles 91 that have already fallen onto the bottom of the chamber 22 may be removed as needed. Since the magnetic particles 91 to be removed are not subjected to the classification operation described above, it is likely that the coating film 92 cannot be formed uniformly. Therefore, the magnetic particles 91 are removed in advance, so that a yield rate of the coated magnetic particles 93 collected after the magnetic particles 91 are removed can be increased. That is, before the energization is stopped, the magnetic particles 91 that have been already fixed onto the collection electromagnet 228 may be removed prior to collecting the coated magnetic particles 93 in a step to be described later.

After the useless magnetic particles 91 are removed in such a manner, the coated magnetic particles 93 to be collected are unfixed. At this time, the collection electromagnet 228 provided at the bottom of the chamber 22 is energized again. Accordingly, the coated magnetic particles 93 to be collected can be fixed onto the collection electromagnet 228.

1.9.8 Collect Coated Magnetic Particles S08

Next, the coated magnetic particles 93 are taken out of the chamber 22 and are collected.

Specifically, the lower flange 226 is separated from the main body portion 222 by the vertical drive unit 229. When the separation is completed, energization to the collection electromagnet 228 is cut off. Accordingly, the coated magnetic particles 93 fixed onto the collection electromagnet 228 can be collected together. Therefore, a collection operation can be easily performed.

As described above, the particle coating device 1 according to the present embodiment includes the chamber 22 that is a container having the powder supply port 2242 that supplies the magnetic particles 91 (a magnetic powder), the first rotation introducer 41 that is provided below the powder supply port 2242 and passes through the inner side and the outer side of the chamber 22, the second rotation introducer 42 that is provided below the first rotation introducer 41 and passes through the inner side and the outer side of the chamber 22, the first magnet roller 51 that is provided inside the chamber 22, is coupled with the first rotation introducer 41, and generates a magnetic field, the second magnet roller 52 that is provided inside the chamber 22, is coupled to the second rotation introducer 42, and generates a magnetic field, the first drive unit 61 that drives the first rotation introducer 41 and rotates the first magnet roller 51, the second drive unit 62 that drives the second rotation introducer 42 and rotates the second magnet roller 52, the control unit 7 that controls an operation of the first drive unit 61 and an operation of the second drive unit 62, and the film forming unit 8 that supplies a coating material for coating the magnetic particles 91 into the chamber 22. The product $r_1\omega_1^2$ of the rotation radius $r_1$ and the square of the rotation speed $\omega_1$ per unit time of the first magnet roller 51 is larger than the product $r_2\omega_2^2$ of the rotation radius $r_2$ and the square of the rotation speed $\omega_2$ per unit time of the second magnet roller 52.

According to the particle coating device 1, the first magnetic particles 911 and the second magnetic particles 912 can be classified based on particle diameters and can be fixed onto the first magnet roller 51 or the second magnet roller 52 in a classified state. Then, in the classified state, the coating film 92 is formed on the surfaces of the magnetic particles 91 when the film forming unit 8 performs a film forming processing. At this time, the first magnetic particles 911 and the second magnetic particles 912 having different particle diameters are fixed onto the first magnet roller 51 and the second magnet roller 52 that are separated from each other. Therefore, it is less likely to have a problem in which particles having a small diameter are hidden behind particles having a large diameter on the magnet rollers as in the related art. Therefore, according to the particle coating device 1 according to the present embodiment, a variation in film thicknesses can be reduced and the coating film 92 can be formed even when there is a distribution of particle diameters of the magnetic particles 91.

Since a large number of magnetic particles 91 are fixed and held by a magnetic force, at the time of forming the coating film 92 by various film forming methods, the magnetic particles 91 are prevented from flying up even when the chamber 22 is exhausted. Therefore, the magnetic particles 91 can be prevented from being caught in the exhaust unit 24, and a failure of the exhaust unit 24 and a loss of the magnetic particles 91 can be prevented.

As shown in FIG. 9, a plurality of magnetic particles 91 are gathered in a needle shape along magnetic force lines, so that gaps can be provided among magnetic particles 91 while the magnetic particles 91 are fixed. Accordingly, most of the surfaces of the magnetic particles 91 are exposed, so that the coating film 92 can be formed to coat the surfaces of the magnetic particles 91 when the coating material supplied by the film forming unit 8 is stacked on the surfaces of the magnetic particles 91 to form the coating film 92. Accordingly, there is an advantage in that a coating ratio of the surfaces of the magnetic particles 91 by the coating film 92 can be easily increased.

Figure 11:
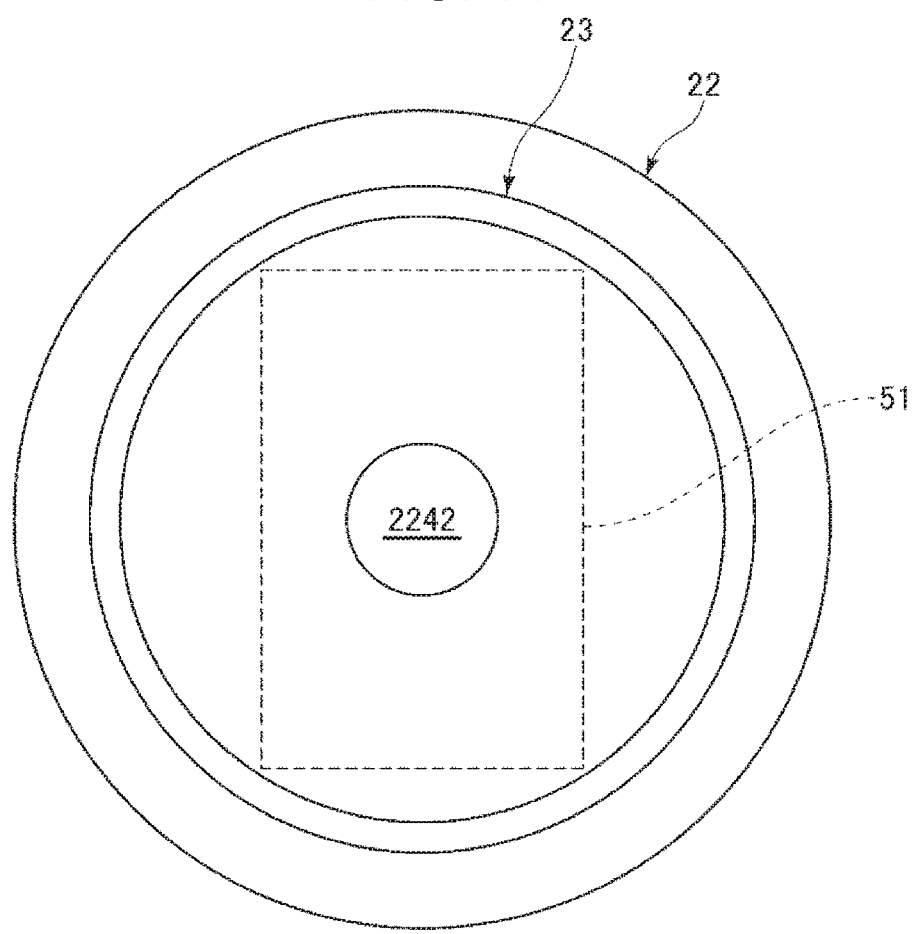
FIG. 11 is a plan view showing the particle coating device shown in FIG. 1 as viewed from above in a vertical direction.
Figure 12:
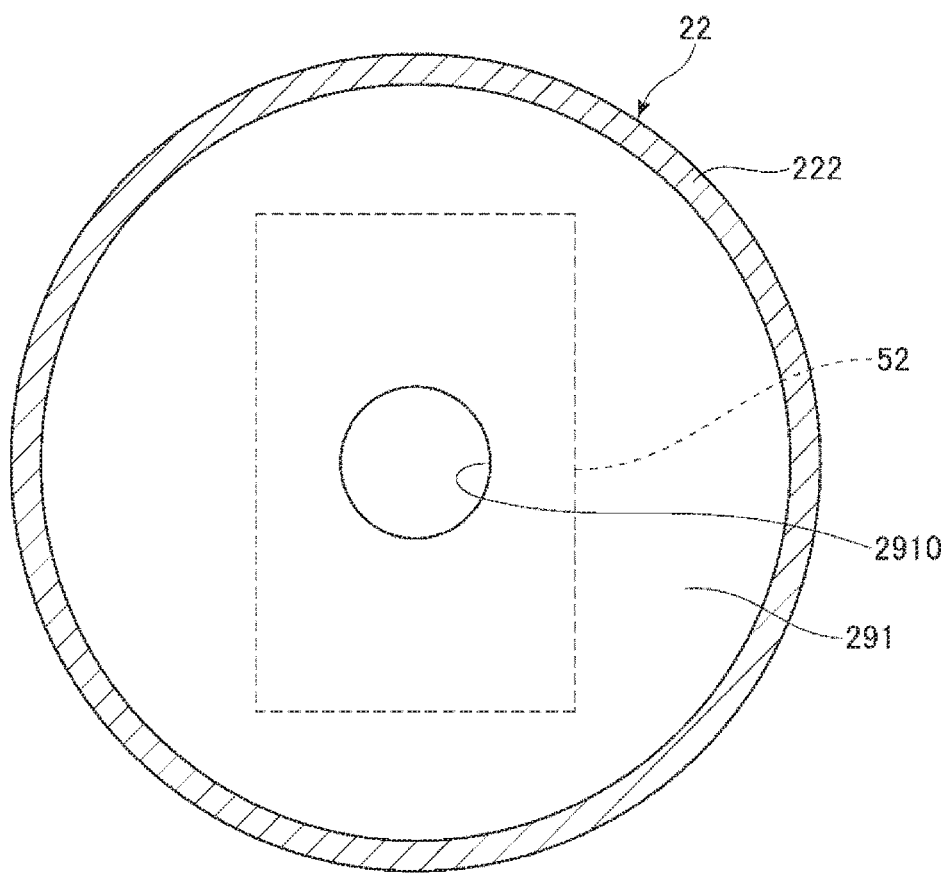
FIG. 12 is a cross-sectional view taken along a line B-B in FIG. 1.

FIG. 11 is a plan view showing the particle coating device 1 shown in FIG. 1 as viewed from above in the vertical direction. FIG. 12 is a cross-sectional view taken along a line B-B shown in FIG. 1.

In the particle coating device 1 according to the present embodiment, it is preferable that a half or more of the powder supply port 2242 provided in the chamber 22 overlaps with the first magnet roller 51, and it is more preferable that the entire powder supply port 2242 overlaps with the first magnet roller 51 in a plan view as viewed from above in the vertical direction, as shown in FIG. 11. Accordingly, since the magnetic particles 91 supplied from the powder supply unit 23 into the chamber 22 fall from directly above the first magnet roller 51, a contact probability with the first magnet roller 51 is increased. As a result, a classification operation can be performed for almost all of the magnetic particles 91 by the first magnet roller 51. Accordingly, a yield of the coated magnetic particles 93 can be increased finally.

A half or more of the powder supply port 2242 overlapping with the first magnet roller 51 refers to a state in which the first magnet roller 51 is visible from a half or more area of the powder supply port 2242 in the plan view. According to the present disclosure, it is not necessary for the powder supply port 2242 and the first magnet roller 51 to overlap with each other, and the powder supply port 2242 and the first magnet roller 51 may be shifted from each other.

The chamber 22 of the particle coating device 1 according to the present embodiment includes a partition wall 291 provided between the first magnet roller 51 and the second magnet roller 52. The partition wall 291 includes an opening 2910 that passes through a central portion in the plan view as viewed from above in the vertical direction. Specifically, the partition wall 291 has an annular shape in the plan view. The partition wall 291 has a shape in which a position of an outer periphery in the vertical direction is higher than a position of an inner periphery. That is, an upper surface of the partition wall 291 is inclined downward toward the opening 2910. Accordingly, the magnetic particles 91 falling on the upper surface of the partition wall 291 move toward an inner peripheral side along the upper surface. Then, the magnetic particles 91 that have reached the opening 2910 fall downward from the opening 2910.

The partition wall 291 is provided, so that the second magnetic particles 912 and the third magnetic particles 913 that fall down and are not fixed onto the first magnet roller 51 can be collected in a region close to a central axis of the chamber 22. Then, the collected second magnetic particles 912 and third magnetic particles 913 can fall toward the second magnet roller 52. Accordingly, the second magnetic particles 912 and the third magnetic particles 913 can be fixed onto the second magnet roller 52 at a higher probability. As a result, the classification operation can be performed for the second magnetic particles 912 and the third magnetic particles 913 by the second magnet roller 52, and finally a variation in the film thicknesses of the coating film 92 can be more reliably prevented.

In a plan view from above in the vertical direction, it is preferable that a half or more of the opening 2910 overlaps with the second magnet roller 52, and it is more preferable that the entire opening 2910 overlaps with the second magnet roller 52. Accordingly, since the second magnetic particles 912 and the third magnetic particles 913 detached from the first magnet roller 51 fall from directly above the second magnet roller 52, a contact probability with the second magnet roller 52 is increased. As a result, the classification operation can be performed on almost all of the second magnetic particles 912 and the third magnetic particles 913 by the second magnet roller 52. Accordingly, a yield of the coated magnetic particles 93 can be increased finally.

A half or more of the opening 2910 overlapping with the second magnet roller 52 refers to a state in which the second magnet roller 52 is visible from a half or more area of the opening 2910 in the plan view. According to the present disclosure, it is not necessary for the opening 2910 and the second magnet roller 52 to overlap with each other, and the opening 2910 and the second magnet roller 52 may be shifted from each other.

Similarly, the chamber 22 of the particle coating device 1 according to the present embodiment includes a partition wall 292 provided between the second magnet roller 52 and the third magnet roller 53. The partition wall 292 includes an opening 2920 that passes through a central portion in the plan view as viewed from above in the vertical direction. Specifically, the partition wall 292 has an annular shape in the plan view. The partition wall 292 has a shape in which a position of an outer periphery in a vertical axis direction is higher than a position of an inner periphery. That is, an upper surface of the partition wall 292 is inclined downward toward the opening 2920. Accordingly, the magnetic particles 91 falling on the upper surface of the partition wall 292 move toward an inner peripheral side along the upper surface. Then, the magnetic particles 91 that have reached the opening 2920 fall downward from the opening 2920.

The partition wall 292 is provided so that the third magnetic particles 913 that fall down and are not fixed onto the second magnet roller 52 can be collected in a region close to the central axis of the chamber 22. Then, the collected third magnetic particles 913 can fall toward the third magnet roller 53. Accordingly, the third magnetic particles 913 can be fixed onto the third magnet roller 53 at a higher probability. As a result, the classification operation can be performed for the third magnetic particles 913 by the third magnet roller 53, and finally a variation in the film thicknesses of the coating film 92 can be more reliably prevented.

In the plan view from above in the vertical direction, a half or more or the entire of the opening 2920 may overlap with the third magnet roller 53. Accordingly, a yield of the coated magnetic particles 93 can be increased finally.

The chamber 22 of the particle coating device 1 according to the present embodiment includes a partition wall 293 provided below the third magnet roller 53. The partition wall 293 has the same shape as the partition walls 291 and 292, and has an opening 2930 at a central portion. Then, the fallen magnetic particles 91 that have a larger diameter than the third magnetic particles 913 and are not fixed onto the third magnet roller 53 can be collected in a region close to the central axis of the chamber 22. Then, the collected magnetic particles 91 having a large diameter can fall toward the collection electromagnet 228. Accordingly, the magnetic particles 91 having a large diameter that may hinder formation of the coating film 92 can be removed by the classification operation performed by the third magnet roller 53. As a result, a yield of the coated magnetic particles 93 to be manufactured can be further increased.

As shown in FIG. 2, the particle coating device 1 further includes a vibration applying unit 294 that applies vibration to the partition wall 291. The partition wall 291 can be vibrated at required timing by providing the vibration applying unit 294. Therefore, when the second magnetic particles 912 and the third magnetic particles 913 detached from the first magnet roller 51, for example, fall downward from the opening 2910, particles remaining on the upper surface of the partition wall 291 can be efficiently moved to the opening 2910 and fall down. Accordingly, even when the partition wall 291 is used, accumulation of the magnetic particles 91 hardly occurs and a defect rate caused by mixing with the accumulated magnetic particles 91 can be prevented from increasing.

The particle coating device 1 further includes a vibration applying unit 295 that applies vibration to the partition wall 292 and a vibration applying unit 296 that applies vibration to the partition wall 293. Particles remaining on upper surfaces of the partition walls 292 and 293 can efficiently fall down by providing the vibration applying units 295 and 296.

Examples of a vibration applying principle of the vibration applying units 294, 295, and 296 include, but not limited to, mechanical vibration application and ultrasonic vibration application.

Figure 13:
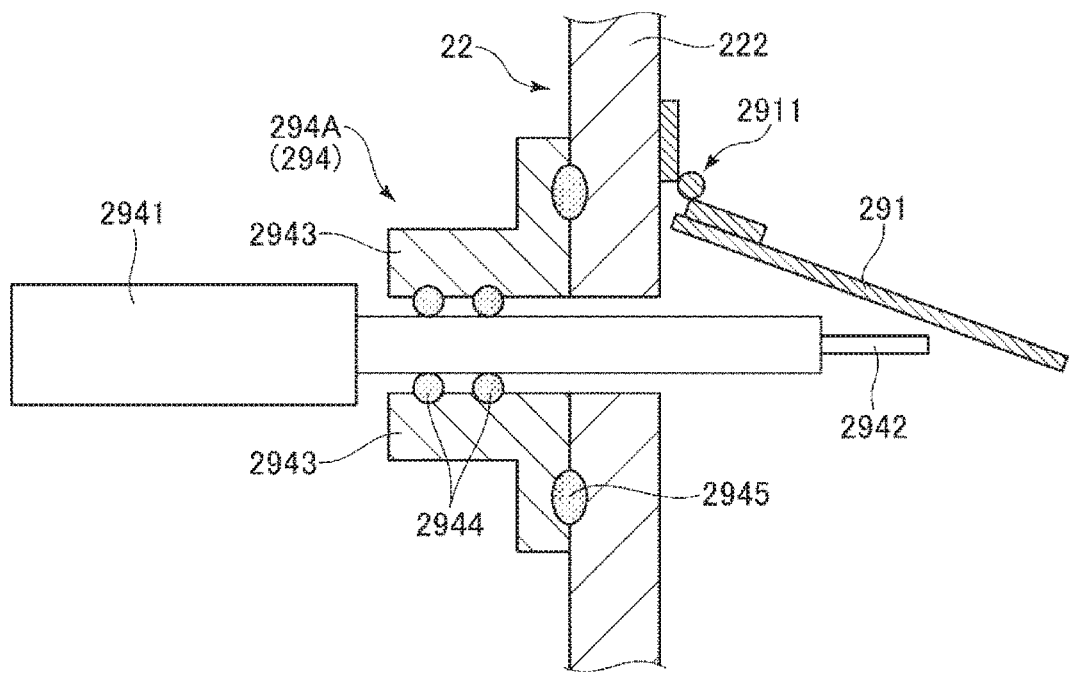
FIG. 13 is a cross-sectional view showing a vibration applying unit when a vibration applying principle is mechanical vibration.

FIG. 13 is a cross-sectional view showing a vibration applying unit 294A when the vibration applying principle is mechanical vibration. A left side in FIG. 13 shows the outer side of the chamber 22 and a right side shows the inner side of the chamber 22.

As an example of the vibration applying units 294, 295, 296, the vibration applying unit 294A shown in FIG. 13 includes a cylinder 2941, a rod 2942, a seal portion 2943, O-rings 2944, and O-rings 2945.

The cylinder 2941 is provided outside the chamber 22 and passes through the outer side and the inner side of the chamber 22. The rod 2942 is driven to reciprocate. The rod 2942 is configured to come into contact with the partition wall 291 during a reciprocating motion. Accordingly, vibration synchronized with the reciprocating motion can be applied to the partition wall 291. An example of the cylinder 2941 includes an air cylinder.

The rod 2942 is a rod-shaped member that reciprocates from the cylinder 2941.

The seal portion 2943 air-tightly couples an outer circumferential surface of a tube of the cylinder 2941 in which the rod 2942 slides with the main body portion 222 of the chamber 22. As shown in FIG. 13, the seal portion 2943 has a cylindrical shape and is coupled to an outer surface of the main body portion 222 via the O-rings 2945. The tube of the cylinder 2941 is continuous with a through hole provided at an inner side of the seal portion 2943 and a through hole provided on the main body portion 222, and is inserted into the through holes. A space between the seal portion 2943 and the outer circumferential surface of the tube is sealed via the O-rings 2944.

Here, the partition wall 291 shown in FIG. 13 is attached to the main body portion 222 via a hinge 2911. Accordingly, the partition wall 291 is easily shifted with respect to the main body portion 222 via the hinge 2911. Therefore, vibration having a sufficient amplitude can be applied to the partition wall 291 by bringing the partition wall 291 into contact with the rod 2942 that reciprocates with respect to the partition wall 291.

Figure 14:
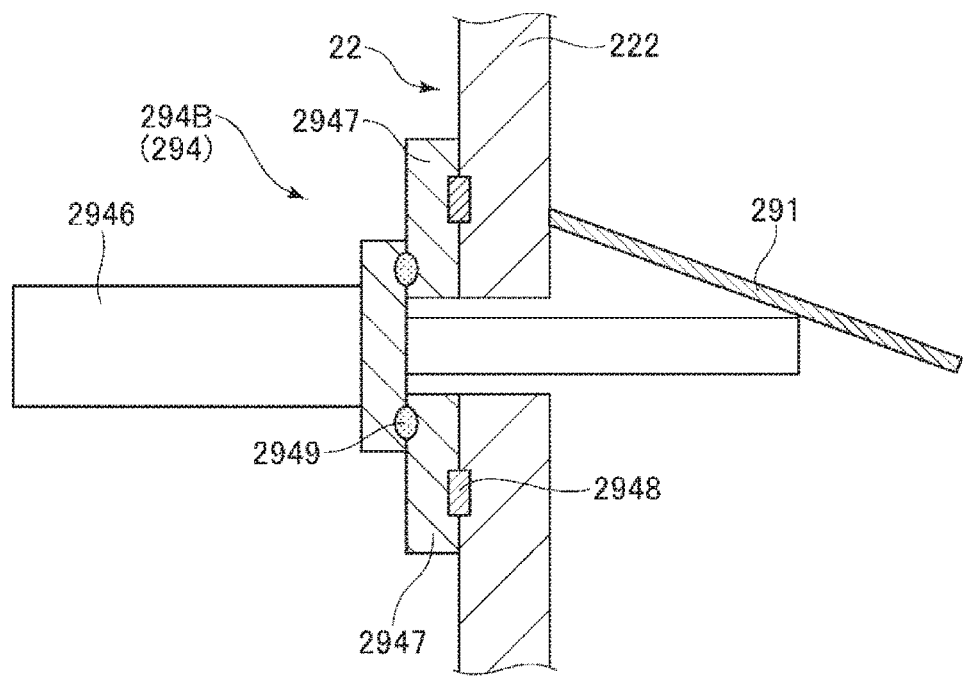
FIG. 14 is a cross-sectional view showing a vibration applying unit when a vibration applying principle is ultrasonic vibration.

FIG. 14 is a cross-sectional view showing a vibration applying unit 294B when the vibration applying principle is ultrasonic vibration. A left side in FIG. 14 shows the outer side of the chamber 22 and a right side shows the inner side of the chamber 22.

As an example of the vibration applying units 294, 295, 296, the vibration applying unit 294B shown in FIG. 14 includes an ultrasonic generator 2946, a mounting flange 2947, metal gaskets 2948, and O-rings 2949.

The ultrasonic generator 2946 is inserted into the mounting flange 2947 and passes through the inner side and the outer side of the chamber 22. A part of the ultrasonic generator 2946 is located inside the chamber 22 and is in contact with the partition wall 291.

The ultrasonic generator 2946 is coupled to the mounting flange 2947 via the O-rings 2949. The mounting flange 2947 is coupled to the main body portion 222 via the metal gaskets 2948.

The ultrasonic generator 2946 generates ultrasonic waves. The generated ultrasonic waves are transmitted to the partition wall 291. Accordingly, vibration can be applied to the partition wall 291.

Instead of the partition wall 291, the vibration applying units 294A and 294B may apply vibration to at least one of the main body portion 222, the upper flange 224, and the lower flange 226.

As described above, the particle coating device 1 according to the present embodiment includes the collection electromagnet 228 provided at an end portion below the chamber 22 which is a container, that is, at the lower flange 226. The coated magnetic particles 93 fall onto the bottom of the chamber 22 can be efficiently collected by using the collection electromagnet 228. As a result, a collection operation of the coated magnetic particles 93 can be efficiently performed.

The chamber 22 which is a container includes the main body portion 222 which is a container main body and the lower flange 226 located below the main body portion 222. The lower flange 226 is separated from the main body portion 222. Accordingly, when the coated magnetic particles 93 are collected, the lower flange 226 can be lowered and separated from the main body portion 222. Accordingly, the collection operation of the coated magnetic particles 93 can be easily performed.

As described above, the particle coating device 1 includes the vertical drive unit 229 that moves up and down the lower flange 226 provided at the end portion of the chamber 22. Therefore, an operation of opening the chamber 22, specifically, an operation of separating the lower flange 226 from the main body portion 222 can be efficiently performed. Accordingly, since the coated magnetic particles 93 on the lower flange 226 can be directly recognized and an instrument or the like can be used, the collection operation can be performed with high efficiency.

Although the particle coating device 1 and the particle coating method have been described above, the number of rotation introducers, magnet rollers, partition walls, and the like that are provided in the particle coating device is not limited to three, and may be two or four or more. The number of the partition walls may be different from the number of magnet rollers or the like.

A water repellent processing may be performed on an inner surface of the chamber 22 which is a container. Accordingly, the magnetic particles 91 can be prevented from adhering onto the inner surface of the chamber 22. In particular, although the pre-processing described above has been performed on the surfaces of the magnetic particles 91 to remove moisture, a small amount of moisture may remain. The moisture may be one cause for the magnetic particles 91 to adhere to the inner surface of the chamber 22. Therefore, adhesion caused by moisture can be prevented by performing the water repellent processing on the inner surface of the chamber 22.

Examples of the water repellent processing include a processing of forming a coating film containing a fluorine-based material or a silicone-based material, and a fluorine plasma processing.

A particle trap (not shown) may be provided in an intermediate portion of the pipe 246 of the exhaust unit 24. The particle trap refers to a mechanism that catches the magnetic particles 91 and the coated magnetic particles 93 that are unintentionally caught in the pipe 246 when the chamber 22 is exhausted. Such a particle trap is provided so that the magnetic particles 91 or the coated magnetic particles 93 can be prevented from reaching up to the exhaust pump 244, and a failure of the exhaust pump 244 can be prevented from occurring.

2. Second Embodiment

Next, the second embodiment will be described.

Figure 15:
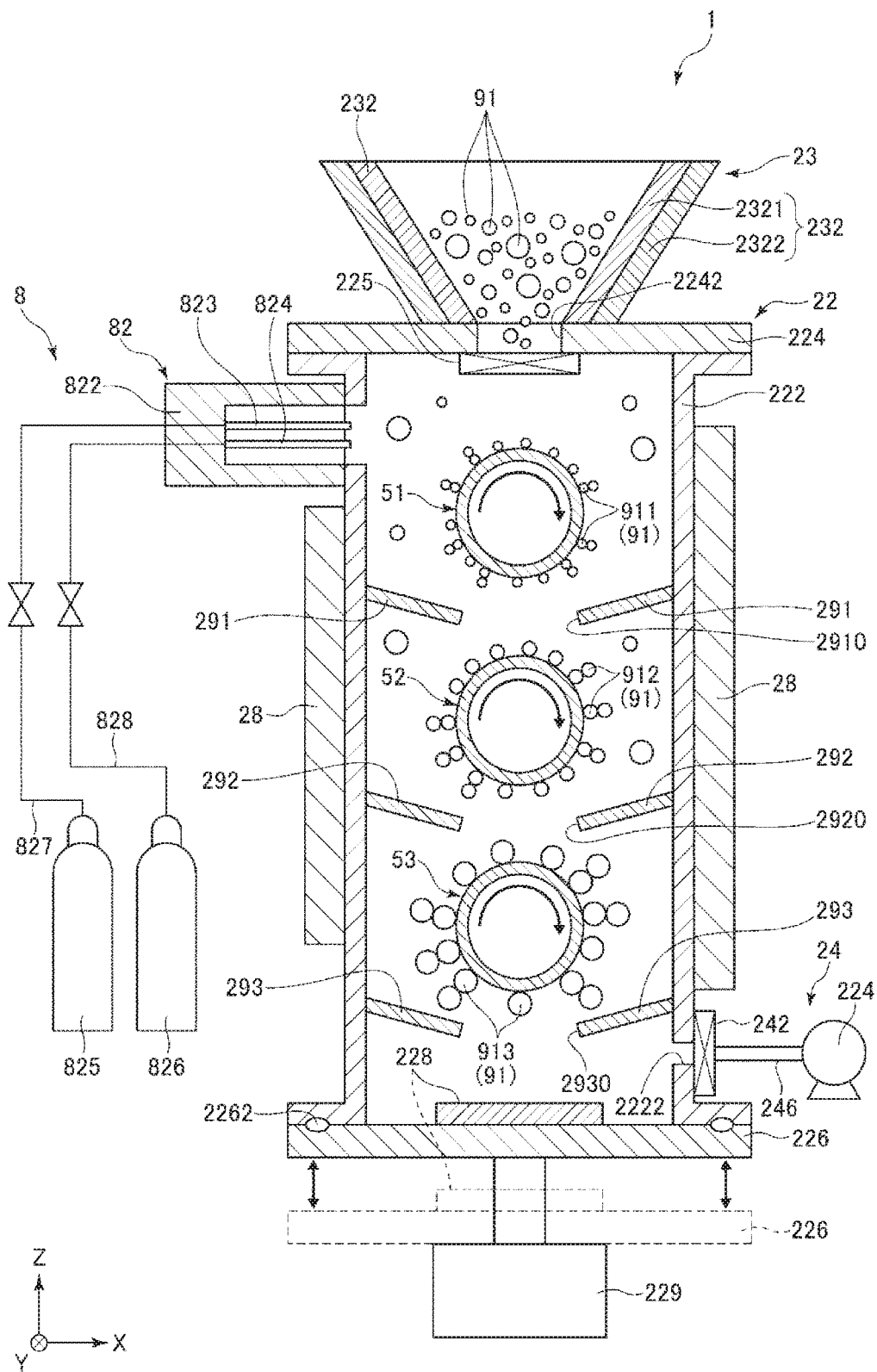
FIG. 15 is a cross-sectional view showing a particle coating device according to a second embodiment.

FIG. 15 is a cross-sectional view showing the particle coating device 1 according to the second embodiment.

Hereinafter, the second embodiment will be described. In the following description, differences from the embodiment described above will be mainly described, and descriptions of the same matters will be omitted. In FIG. 15, configurations the same as those in the first embodiment described above are denoted by the same reference numerals.

The particle coating device 1 shown in FIG. 15 includes the powder storage unit 232 that is provided above the powder supply port 2242 provided in the upper flange 224 and stores the magnetic particles 91 (a powder). The powder storage unit 232 includes a mechanism that heats the magnetic particles 91. Specifically, the powder storage unit 232 shown in FIG. 15 includes a storage body 2321 and a heating unit 2322 that heats the magnetic particles 91 stored in the storage body 2321.

The magnetic particles 91 can be heated from a stage before the magnetic particles 91 are supplied into the chamber 22 by providing the heating unit 2322. Accordingly, the magnetic particles 91 can be supplied into the chamber 22 in a heated state. As a result, even when a heating rate of the magnetic particles 91 in the chamber 22 is not sufficient, temperature of the magnetic particles 91 can be sufficiently raised. Therefore, a film formation property of the coating film 92 can be improved, and the coating film 92 whose film thickness is prevented from varying can be efficiently formed.

When the storage body 2321 is translucent, an infrared radiation heater or the like is used as the heating unit 2322.

When the storage body 2321 is not translucent, a resistance heating heater or the like is used as the heating unit 2322.

As described above, if the temperature of the magnetic particles 91 can be raised from the stage before the magnetic particles 91 are supplied into the chamber 22, a secondary effect can be obtained that the heating rate of the magnetic particles 91 in the chamber 22 may not be significantly increased. In view of such an effect, a non-translucent material, for example, a metal material such as stainless steel, aluminum, or titanium can be used as a constituent material of the chamber 22 in the present embodiment. Accordingly, a low cost and a high strength of the chamber 22 can be expected.

In this case, the heating unit 28 may be a resistance heating heater that can heat the chamber 22, such as a heater block with a built-in heater wire, a film heater, a sheet heater, and a sheathed heater.

The second embodiment described above has the same effect as the first embodiment.

3. Third Embodiment

Next, the third embodiment will be described.

Figure 16:
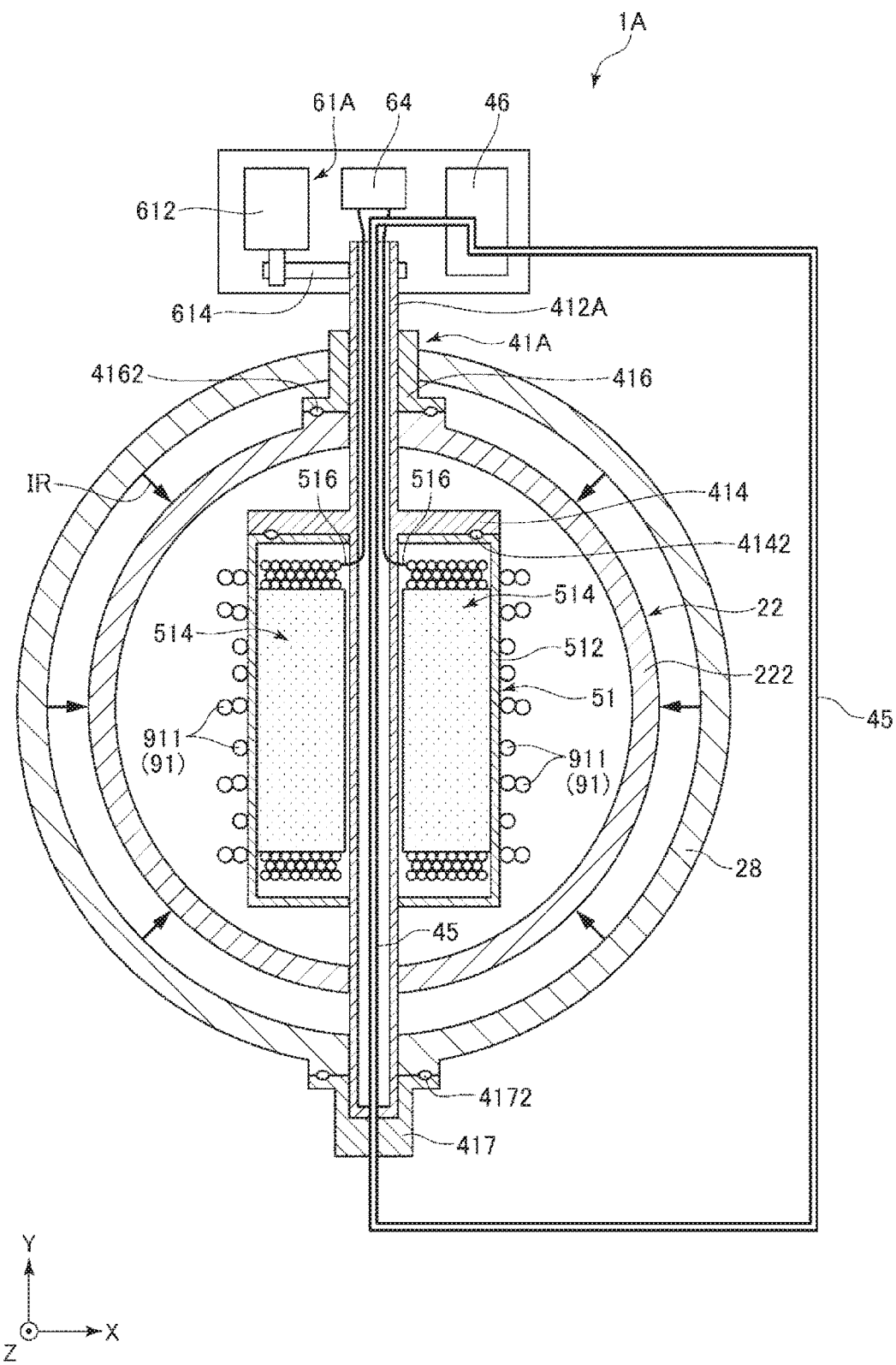
FIG. 16 is a cross-sectional view showing a particle coating device according to a third embodiment.

FIG. 16 is a cross-sectional view showing a particle coating device 1A according to the third embodiment.

Hereinafter, the third embodiment will be described. In the following description, differences from the embodiments described above will be mainly described, and descriptions of the same matters will be omitted. In FIG. 16, configurations the same as those in the first embodiment described above are denoted by the same reference numerals.

The particle coating device 1A according to the present embodiment is similar to the particle coating device 1 according to the first embodiment other than a different configuration of a rotation introducer or the like.

A first rotation introducer 41A shown in FIG. 16 includes a hollow shaft 412A that passes through the first magnet roller 51 and a side wall of the chamber 22. Other than this point, the hollow shaft 412A is similar to the hollow shaft 412 in the first embodiment.

As described above, the hollow shaft 412A passes through the first magnet roller 51. Therefore, the first magnet roller 51 can be supported from two sides and the first magnet roller 51 can be rotated stably. The hollow shaft 412A also passes through the side wall of the chamber 22 at two positions. Therefore, the hollow shaft 412A can be supported stably even when, for example, a weight of the first magnet roller 51 increases.

In the above configuration, two end portions of the hollow shaft 412A can be provided outside the chamber 22. Therefore, there is an advantage in that an operation of inserting the wire 516 into the hollow shaft 412A is easily performed and a diameter of the hollow shaft 412A is less likely to increase even when the number of the wire 516 increases.

To make use of the advantage, the particle coating device 1A according to the present embodiment includes a cooling pipe 45 inserted into the hollow shaft 412A and a cooler 46 that cools a refrigerant flowing through the cooling pipe 45.

The cooling pipe 45 is inserted into the hollow shaft 412A and extends to outside of the chamber 22 to form a circulation path. The first magnet roller 51 or an inner side of the first magnet roller 51 can be cooled by circulating the refrigerant in the cooling pipe 45. Accordingly, a high-temperature failure of an electromagnet or the like can be prevented.

The cooler 46 lowers temperature of the refrigerant by natural heat dissipation or forced heat dissipation.

Mechanisms (not shown) capable of rotating the hollow shaft 412A in a state in which the cooling pipe 45 is inserted into the hollow shaft 412A may be provided at two end portions of the hollow shaft 412A. An example of such a mechanism includes a rotary joint or the like.

In addition to the configuration of the first rotation introducer 41 in the first embodiment, the first rotation introducer 41A includes a seal portion 417 and O-rings 4172. Of the two end portions of the hollow shaft 412A, the seal portion 417 supports the end portion at an opposite side to the first drive unit 61 as shown in FIG. 16.

The seal portion 417 air-tightly seals an outer surface of the hollow shaft 412A. For example, various dynamic vacuum seals described above are used as the seal portion 417. The seal portion 417 and the main body portion 222 are air-tightly coupled to each other via the O-rings 4172.

Although not shown in FIG. 16, a second rotation introducer and a third rotation introducer may have the same configurations as the first rotation introducer 41A.

As described above, when the first rotation introducer 41 includes the hollow shaft 412A, the hollow shaft 412A of the first rotation introducer 41 passes through the first magnet roller 51. Although not shown, when the second rotation introducer includes a hollow shaft the same as the hollow shaft 412A, the hollow shaft of the second rotation introducer may pass through the second magnet roller.

According to such a configuration, since the first magnet roller 51 or the second magnet roller can be supported from two sides, the magnet rollers can be rotated stably. Therefore, classification operations can be performed with higher accuracy by the magnet rollers.

The third embodiment described above has the same effect as the first embodiment.

Although the particle coating device according to the present disclosure has been described above based on the shown embodiments, the present disclosure is not limited thereto. In the particle coating device according to the present disclosure, for example, a configuration of each unit in the embodiments may be replaced with any configuration having the same function. Any other components may be added to the embodiments of the particle coating device according to the present disclosure.

What is claimed is:

1. A particle coating device comprising:
    a container having a powder supply port that supplies a powder;
    a first rotation introducer that is provided below the powder supply port and passes through an inner side and an outer side of the container;
    a second rotation introducer that is provided below the first rotation introducer and passes through the inner side and the outer side of the container;
    a first magnet roller that is provided inside the container, is coupled with the first rotation introducer, and generates a magnetic field;
    a second magnet roller that is provided inside the container, is coupled with the second rotation introducer, and generates a magnetic field;
    a first drive unit that drives the first rotation introducer and rotates the first magnet roller;
    a second drive unit that drives the second rotation introducer and rotates the second magnet roller;
    a control unit that controls an operation of the first drive unit and an operation of the second drive unit; and
    a film forming unit that supplies a coating material for coating particles in the powder into the container, wherein a product $r_1\omega_1^2$ of a rotation radius $r_1$ and a square of a rotation speed $\omega_1$ per unit time of the first magnet roller is larger than a product $r_2\omega_2^2$ of a rotation radius $r_2$ and a square of a rotation speed $\omega_2$ per unit time of the second magnet roller.

2. The particle coating device according to claim 1, wherein a half or more of the powder supply port overlaps with the first magnet roller in a plan view from above in a vertical direction.

3. The particle coating device according to claim 1, further comprising: a partition wall that is provided between the first magnet roller and the second magnet roller and includes an opening.

4. The particle coating device according to claim 3, wherein a half or more of the opening overlaps with the second magnet roller in a plan view from above in a vertical direction.

5. The particle coating device according to claim 3, further comprising: a vibration applying unit that applies vibration to the partition wall.

6. The particle coating device according to claim 1, wherein at least one of the first rotation introducer and the second rotation introducer includes a hollow shaft.

7. The particle coating device according to claim 6, wherein
    when the first rotation introducer includes the hollow shaft, the hollow shaft of the first rotation introducer passes through the first magnet roller, and
    when the second rotation introducer includes the hollow shaft, the hollow shaft of the second rotation introducer passes through the second magnet roller.

8. The particle coating device according to claim 1, wherein at least one of the first magnet roller and the second magnet roller is an electromagnetic roller.

9. The particle coating device according to claim 1, further comprising: an electromagnet provided at an end portion below the container.

10. The particle coating device according to claim 9, wherein
the container includes a container main body, and
the end portion is provided below the container main body and separated from the container main body.

11. The particle coating device according to claim 10, further comprising:
a lower flange having an end portion, wherein
the lower flange is configured to be moved up and down.

12. The particle coating device according to claim 1, further comprising: a powder storage unit that is provided above the powder supply port and stores the powder, wherein the powder storage unit includes a mechanism that heats the powder.

* * * * *